(12) United States Patent
Hone et al.

(10) Patent No.: US 10,985,704 B2
(45) Date of Patent: Apr. 20, 2021

(54) AMPLIFIER CIRCUIT AND TRANSMITTING DEVICE

(71) Applicants: KABUSHIKI KAISHA TOSHIBA, Minato-ku (JP); TOSHIBA INFRASTRUCTURE SYSTEMS & SOLUTIONS CORPORATION, Kawasaki (JP)

(72) Inventors: Thomas Martin Hone, Yokohama (JP); Atsushi Yamaoka, Yokohama (JP); Keiichi Yamaguchi, Kawasaki (JP)

(73) Assignees: KABUSHIKI KAISHA TOSHIBA, Minato-ku (JP); TOSHIBA INFRASTRUCTURE SYSTEMS & SOLUTIONS CORPORATION, Kawasaki (JP)

( * ) Notice: Subject to any disclaimer, the term of this patent is extended or adjusted under 35 U.S.C. 154(b) by 38 days.

(21) Appl. No.: 16/292,736

(22) Filed: Mar. 5, 2019

(65) Prior Publication Data
US 2020/0091869 A1 Mar. 19, 2020

(30) Foreign Application Priority Data
Sep. 14, 2018 (JP) .............................. JP2018-172554

(51) Int. Cl.
*H03F 3/68* (2006.01)
*H03F 1/02* (2006.01)
(Continued)

(52) U.S. Cl.
CPC ........... *H03F 1/0288* (2013.01); *H03F 3/245* (2013.01); *H04B 1/0475* (2013.01);
(Continued)

(58) Field of Classification Search
CPC .. H03F 1/0288; H03F 3/245; H03F 2200/423; H03F 2200/387;
(Continued)

(56) References Cited

U.S. PATENT DOCUMENTS

| 7,511,575 | B2 * | 3/2009 | Gotou ..................... H03F 3/211 |
| | | | 330/124 R |
| 8,022,760 | B2 | 9/2011 | Gajadharsing et al. |

(Continued)

FOREIGN PATENT DOCUMENTS

JP 2019-57809 A 4/2019

OTHER PUBLICATIONS

Canning, T., et al. "Continuous Mode Power Amplifier Design Using Harmonic Clipping Contours: Theory and Practice", IEEE Transactions on Microwave Theory and Techniques, vol. 62, No. 1, 2014, 11 pages.

*Primary Examiner* — Khanh V Nguyen
*Assistant Examiner* — Khiem D Nguyen
(74) *Attorney, Agent, or Firm* — Oblon, McClelland, Maier & Neustadt, L.L.P.

(57) ABSTRACT

According to one embodiment, an amplifier circuit includes N (N>=3) transistors, two first branches and N−2 second branches. The N (N>=3) transistors are connected in parallel. The two first branches each include the transistor and a first transmission line which is connected to an output terminal of the transistor. The N−2 second branches each include the transistor and a second transmission line which is connected to the output terminal of the transistor. For each of the first branches, a sum between an electrical length of a parasitic component of the transistor and the electrical length of the first transmission line are odd multiples of approximately 90 degrees. For each of the second branches, the sum between the electrical length of the parasitic com-
(Continued)

ponent of the transistor and the electrical length of the second transmission line are multiples of approximately 180 degrees.

17 Claims, 26 Drawing Sheets

(51) Int. Cl.
  *H03F 3/24*     (2006.01)
  *H04B 1/04*     (2006.01)

(52) U.S. Cl.
  CPC .. *H03F 2200/387* (2013.01); *H03F 2200/423* (2013.01); *H03F 2200/451* (2013.01); *H03F 2203/21106* (2013.01); *H03F 2203/21139* (2013.01); *H03F 2203/21142* (2013.01); *H03F 2203/21178* (2013.01); *H04B 2001/045* (2013.01)

(58) Field of Classification Search
  CPC ..... H03F 2203/21106; H03F 2200/451; H03F 2203/21139; H03F 2203/21178; H03F 2203/21142; H03F 1/56; H03F 3/602; H03F 3/211; H04B 1/0475; H04B 2001/045
  USPC ...................................... 330/124 R, 295, 302
  See application file for complete search history.

(56) References Cited

U.S. PATENT DOCUMENTS

| | | |
|---|---|---|
| 9,667,199 B1 | 5/2017 | McLaren |
| 2019/0089312 A1 | 3/2019 | Hone et al. |

\* cited by examiner

| RELATIONSHIP | OPERATING TRANSISTOR(S) |
|---|---|
| $v_G < V_{TH}-V_{GS2}$ | #1 |
| $V_{TH}-V_{GS2} \leq v_G < V_{TH}-V_{GS3}$ | #1, #2 |
| $V_{TH}-V_{GS3} \leq v_G < V_{TH}-V_{GS4}$ | #1, #2, #3 |
| $V_{TH}-V_{GS4} \leq v_G < V_{TH}-V_{GS5}$ | #1, #2, #3, #4 |
| ⋮ | ⋮ |

TRANSISTOR #1 IS A MAIN TRANSISTOR

TRANSISTORS #2- ARE PEAK TRANSISTORS

FIG. 3

ELECTRICAL LENGTH BETWEEN AA' IS < 180 DEGREES

EXAMPLE OF HARMONIC IMPEDANCE MEASURED FROM INTRINSIC REGION OF AN IDEALISTIC TRANSISTOR

APPROXIMATE PLANAR VIEWS OF THE FIRST TRANSMISSION LINE, THE SECOND TRANSMISSION LINE AND THE IMPEDANCE CONVERTER

APPROXIMATE PLANAR VIEWS OF THE FIRST TRANSMISSION LINE, THE SECOND TRANSMISSION LINE AND THE IMPEDANCE CONVERTER

AMPLIFIER CIRCUIT AND TRANSMITTING DEVICE

CROSS-REFERENCE TO RELATED APPLICATIONS

This application is based upon and claims the benefit of priority from Japanese Patent Application No. 2018-172554, filed on Sep. 14, 2018; the entire contents of which are hereby incorporated by reference.

FIELD

Embodiments described herein relate generally to an amplifier circuit and a transmitting device.

BACKGROUND

In wireless communication, signals with large amplitude level fluctuations need to be amplified efficiently. For some signals, the peak power and the average power may differ in the order of Decibels. However, the power efficiency suffers if the voltage of the input signal of a transistor diverges from the rated voltage. For amplifying signals with high power efficiency, a plurality of transistors connected in parallel can be used. Examples of such circuits include Doherty amplifier circuits. In Doherty amplifier circuits, the bias (DC) voltages applied to the gate terminals for each of the transistors are configured to different values.

Combiners of Doherty amplifier circuits include λ/4 lines. However, due to the presence of parasitic components in the circuit and the harmonic components in the signal, efficient amplification of signals may become difficult.

BRIEF DESCRIPTION OF THE DRAWINGS

FIG. 3 is a table presenting a relation between the gate voltages and operating transistors;

DETAILED DESCRIPTION

According to one embodiment, an amplifier circuit includes N (N>=3) transistors, two first branches and N−2 second branches. The N (N>=3) transistors are connected in parallel. The two first branches each include a transistor and a first transmission line which is connected to an output terminal of the transistor. The N−2 second branches each include a transistor and a second transmission line which is connected to the output terminal of the transistor. For each of the first branches, the sum between the electrical length of parasitic components of the transistor and the electrical length of the first transmission line are odd multiples of approximately 90 degrees. For each of the second branches, the sum between the electrical length of the parasitic components of the transistor and the electrical length of the second transmission line are multiples of approximately 180 degrees.

Hereinafter, embodiments of the present invention will be described with reference to the drawings.

First Embodiment

Figure 1:
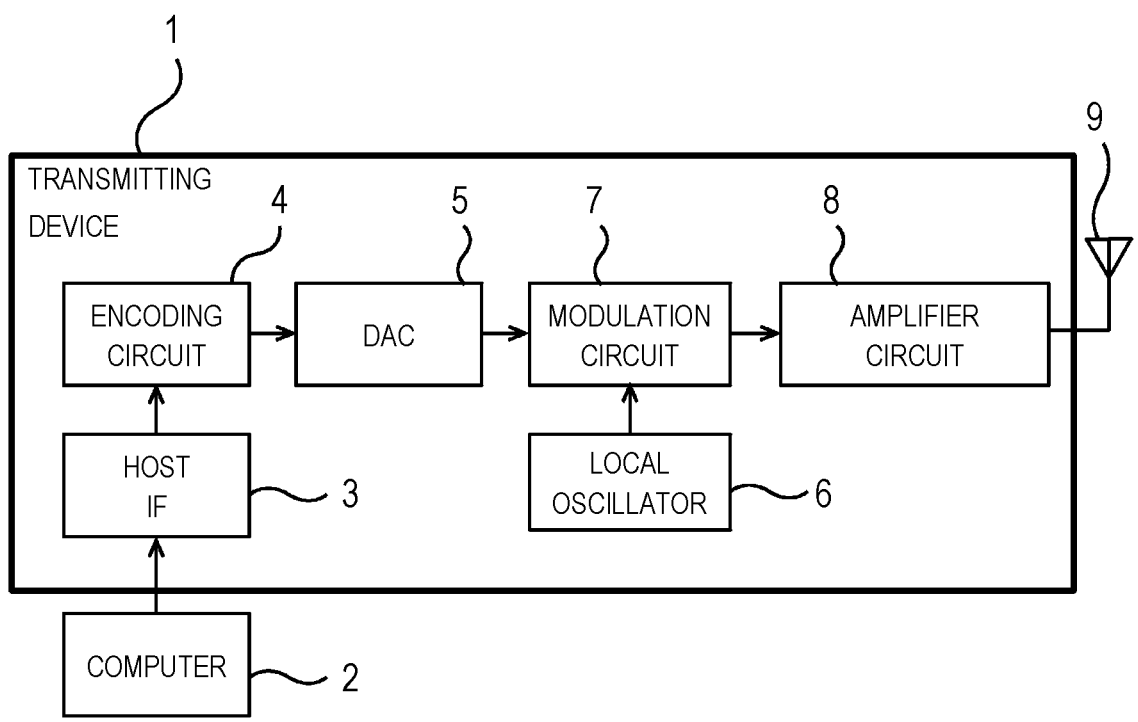
FIG. 1 is a block diagram illustrating a configuration example of a transmission device according to a first embodiment.

FIG. 1 is a block diagram illustrating a configuration example of a transmission device according to a first embodiment. A transmission device according to a first embodiment will be described with reference to FIG. 1. The transmission device 1 in FIG. 1 is connected electrically to a computer 2. The transmission device 1 transmits data transferred from the computer 2 by wireless communication. The transmission device 1 includes a host interface (host IF) 3, an encoding circuit 4, a D/A converter (DAC) 5, a local oscillator 6, a modulation circuit 7, an amplifier circuit 8 and an antenna 9.

The host interface 3 enables communication of data between the transmission device 1 and the computer 2. Examples of the host interface 3 include PCI Express, USB, UART, SPI, SDIO and Ethernet. However, any other interface can be used. The encoding circuit 4 encodes the data transferred from the host interface 3. Examples of the encoding methods used by the encoding circuit 4 include various block codes and convolutional codes. However, any type of encoding method can be used. The D/A converter 5 converts digital signals to analog signals.

The local oscillator 6 is a circuit which generates signals for frequency conversion. The signal generated by the local oscillator is provided to the modulation circuit 7. The modulation circuit 7 executes analog modulation of signals. Also, the modulation circuit 7 converts baseband frequency signals to carrier frequency signals. Examples of analog modulation methods include amplitude modulation, frequency modulation and phase modulation. The amplifier circuit 8 amplifies carrier frequency signals. The signal amplified by the amplifier circuit is transmitted via the antenna 9.

The configuration of the transmission device 1 in FIG. 1 is only an example. As long as the amplifier circuit 8 is included, the configuration of the transmission device 1 can be different. For example, the transmission device 1 can be a device which executes digital modulation. Examples of digital modulation methods include FSK (Frequency Shift Keying), BPSK, QAM and OFDM (orthogonal frequency division multiplexing). However, any other method can be used. Also, the transmission device 1 in FIG. 1 can be a wireless communication device which includes components for receiving wireless signals and components for transmitting wireless signals.

The communication method and communication standard used by the transmission device 1 (wireless communication device) are not limited. The values of the aforementioned baseband frequency and the aforementioned carrier frequency are not limited. The transmission device 1 (wireless communication device) can be used for mobile communication, wireless LAN (IEEE 802.11 series or successor standards), television broadcasting and radars, for example. However, the usage of the transmission device 1 (wireless communication device) is not limited.

Figure 2:
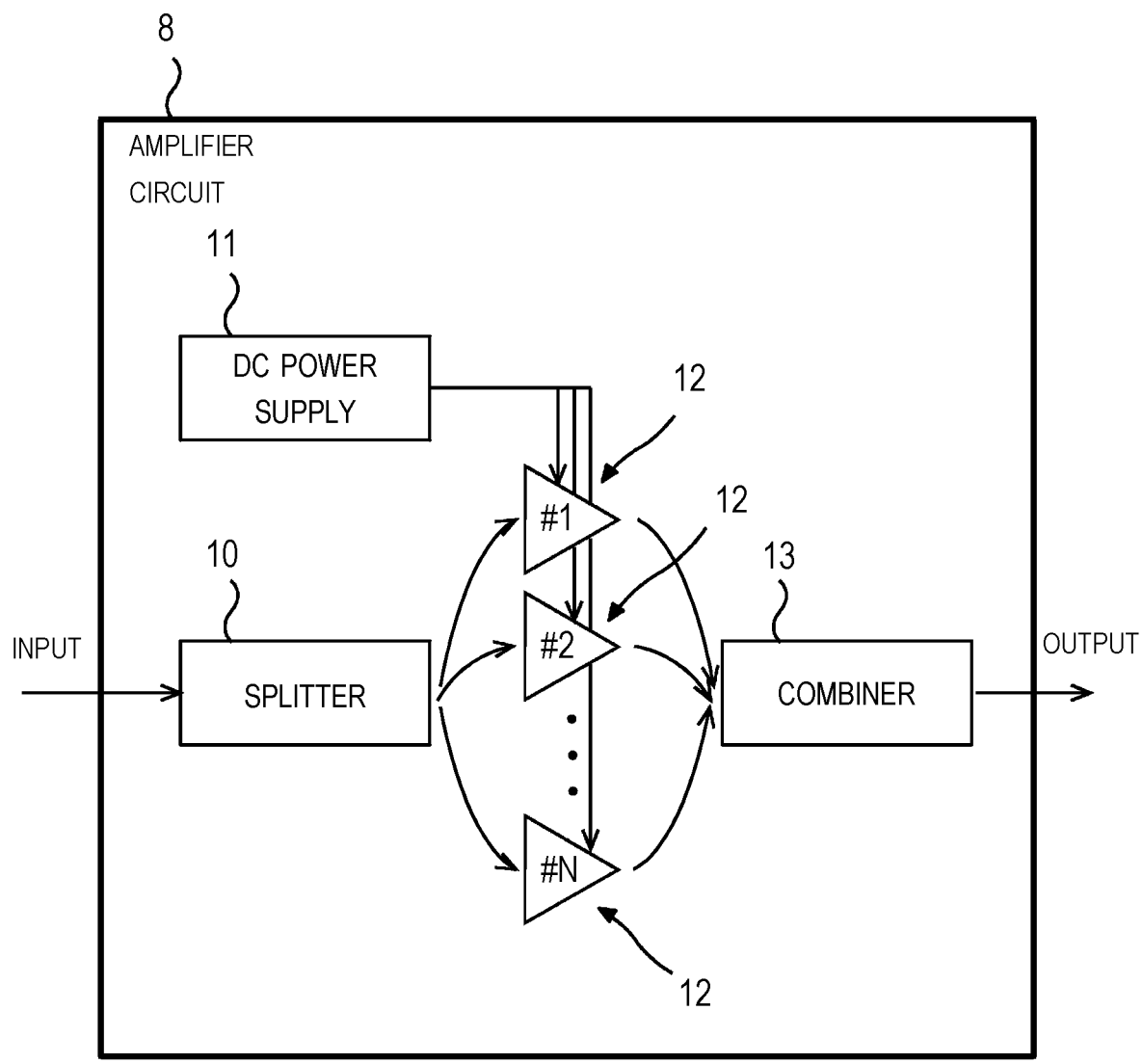
FIG. 2 is a block diagram illustrating a configuration example of an amplifier circuit.

Next, examples of the wireless communication device according to the embodiment are described. FIG. 2 is a block diagram illustrating a configuration example of an amplifier circuit. The amplifier circuit 8 in FIG. 2 includes a splitter 10, a DC power supply 11, a plurality of amplifying elements 12 (amplifying elements #1 to #N) and a combiner 13. The plurality of amplifying elements 12 (amplifying elements #1 to #N) are connected in parallel. The splitter 10 splits the signal entered into the amplifier circuit 8. The outputs of the splitter 10 are connected to the amplifying elements #1 to #N. The DC power supply 11 is connected to at least one of the amplifying elements 12. The signals amplified by the amplifying elements #1 to #N are fed into the combiner 13. The combiner 13 provides the combined signal from the output side. In other words, the combiner 13 is configured to provide an output signal combining the input signals entered from a plurality of circuit branches in the amplifier circuit. Each of the circuit branches includes an amplifying element 12. Details of the circuit branches (abbreviated as branches) are described later.

Examples of the amplifying elements 12 (amplifying elements #1 to #N) include transistors such as field-effect transistors and bipolar transistors. However, the type of device used is not limited. Next, cases where field-effect transistors are used as the amplifying element 12 are explained as examples. Since FIG. 2 is a diagram which illustrates an outline of the configuration, some of the components in the amplifier circuit 8 are not shown. Details of the amplifier circuit 8 are described later. To amplify signals with large fluctuations in the amplitude with high power efficiency, circuits including transistors connected in parallel (as shown in example of FIG. 2) can be used.

In the following description, the gate terminal of the field-effect transistor is used as the input terminal of the transistor. Also, the drain terminal of the field-effect transistor is used as the output terminal of the transistor. The transistor starts to amplify signals when the voltage applied to the gate terminal exceeds the threshold voltage. The electric signal applied to the gate terminal includes a DC (direct current) voltage component and a AC (alternating current) voltage components. The DC voltage component of the electric signals can be provided by a DC stabilized power supply. The AC voltage component of the electric signals can be provided from a signal source or an amplifier in a previous circuit stage. By adjusting the DC voltage provided by the power supply, it is possible to change the input voltage level when each of the transistors connected in parallel starts to amplify a signal.

The DC voltage applied to the gate terminal of the transistor #1 is $V_{GS1}$. The DC voltage applied to the gate terminal of the transistor #2 is $V_{GS2}$. The DC voltage applied to the gate terminal of the transistor #3 is $V_{GS3}$. To ensure that: the transistor #1 starts amplifying signals at the lowest AC voltage; the transistor #2 starts amplifying signals at AC voltage higher than the transistor #1; and the transistor #3 starts amplifying signals at AC voltage higher than the transistor #2, the absolute value of the DC voltage applied to the gate terminals needs to satisfy the relation $V_{GS1} > V_{GS2} > V_{GS3}$.

If the same type of transistors is used, the gate threshold voltage $V_{TH}$ would be ideally constant. The greater the absolute value of a given DC voltage is, the easier it is for electric signals with AC voltage components to exceed the gate threshold voltage $V_{TH}$, even when the AC voltage components only have small amplitudes. If the absolute value of the DC voltage applied to the gate terminals satisfies the above relation, the transistors start to operate in the order of: the transistor #1, the transistor #2 and the transistor #3, if the power of the input signal increases. In the discussion above, it was supposed that the gate threshold voltage for each of the transistors were equal. However, a combination of different transistors can be used.

In actual transistors, the gate threshold voltages do not necessary match. In some cases, the gate threshold voltage varies even for transistors of the same type and scale. Therefore, it is necessary to determine the DC voltage applied to the transistors, considering the differences in the gate threshold voltages. For example, suppose that the threshold voltages of transistors #1, #2 and #3 are 2V, 4V and 5V, respectively. In this case, $V_{GS1}$ can be set to 2V. $V_{GS2}$ can be set to 3V. $V_{GS3}$ can be set to 3.5V. Here, the DC voltage applied does not necessary have to be positive voltages. Thus, depending on the characteristics of the transistors which are used, either positive voltages or negative voltages can be applied. For example, if depletion-type transistors are used, the DC voltage applied would be a negative voltage.

The operating class depends on factors other than the DC voltage applied to the gate terminal. The operating class also depends on the relation between the applied DC voltage and the gate threshold voltage. This relation is called the conduction angle or the depth of bias. If the conduction angle becomes greater, the bias becomes shallower. In this case, the operating class becomes closer to the class A. If the conduction angle becomes smaller, the bias becomes deeper. In this case, the operating class becomes closer to the class C. If the DC voltage applied to the gate terminal satisfies the above relation, the conduction angle becomes smaller (the bias becomes deeper or the operating class becomes closer to class C rather than class A) in the order of the transistor #1, the transistor #2 and the transistor #3.

The table of FIG. 3 includes the relation between the AC component of the gate voltage $v_G$ and which transistors operate. If a field-effect transistor is operating, a current flows between the drain terminal and the source terminal. Suppose that a DC voltage greater than the threshold voltage is applied to the gate terminal of the transistor #1 to ensure that the transistor #1 is always operating. Therefore, the relation, $V_{TH}-V_{GS1}<=0$ is satisfied for the transistor #1. This is the condition for class A operation and class B operation. However, it is possible to configure the bias voltage $V_{GS1}$ smaller than the threshold voltage, setting the bias deeper than class B. If the gate AC voltage is satisfying the relation $V_G<V_{TH}-V_{GS2}$, only the transistor #1 operates. If the gate AC voltage is satisfying the relation $V_{TH}-V_{GS2}<=V_G<V_{TH}-V_{GS3}$, the transistor #1 and the transistor #2 operate.

If the gate AC voltage is satisfying the relation $V_{TH}-V_{GS3}<=V_G<V_{TH}-V_{GS4}$, the transistors #1 to #3 operate. If the AC voltage applied to the gate terminal increases, each of the transistors starts to operate in the specified order. Each of the operating transistors contributes to the amplification of signals. The aforementioned operation of the transistors is the first characteristic of a Doherty amplifier circuit.

The second characteristic of a Doherty amplifier circuit is the fact that the load impedance for each of the transistors changes dynamically along with the operation of the transistors. This phenomenon is called active load pull. Suppose that a single load is connected to two current sources. If active load pull occurs, the currents provided from each of the current sources effect the load impedance of the other current source. In a two-level Doherty amplifier circuit using two transistors, it is possible to connect a transmission line with electrical length of 90 degrees (λ/4 line) to the drain terminal of the transistor #1. Thereby, it is ensured that the amplitude of the output voltage of the transistor #1 reaches to the maximum voltage amplitude, even when the transistor #1 is in a back-off state. If the transistor #1 is in the back-off state, its output power during operation is smaller than the other transistors.

If an AC voltage with greater amplitude is entered, both the transistor #1 and the transistor #2 operate. In this case, the amplitude of the output voltage of transistor #1 still maintains the maximum voltage amplitude. The load impedance of the transistor #1 and the transistor #2 can be adjusted to ensure that the amplitude of the output voltage for the transistor #1 and the transistor #2 is equal to the maximum amplitude, when the amplitude of the input voltage takes the maximum value.

λ/4 lines are used in the combiner of a Doherty amplifier circuit to enable the aforementioned active load pull operation. As described in FIG. 4, the Doherty amplifier circuit can be designed by connecting the transistor and the λ/4 line in series.

Figure 4:
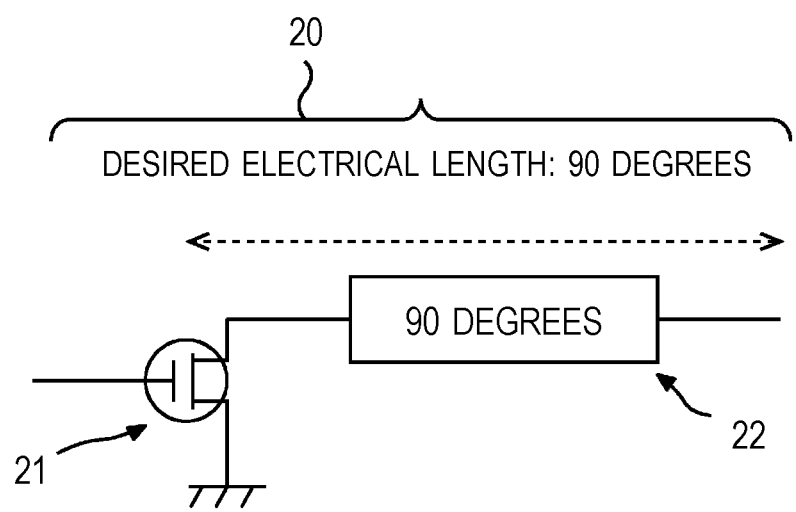
FIG. 4 is a diagram illustrating a transistor and a λ/4 line connected in series.

Referring to branch 20 in FIG. 4, a transistor 21 and a transmission line 22 are connected in series. The transmission line 22 is connected to the output terminal of the transistor 21. If the transistor 21 is a field-effect transistor, the drain terminal can be used as the output terminal. However, any other terminal can be used. Since the electrical length of the transmission line 22 is approximately 90 degrees (approximately λ/4), the transmission line 22 is a λ/4 line. In the following, if an electrical length is referred, it indicates the electrical length of a path within the circuit at the carrier frequency. Here, the electrical length of a path includes the electrical length of transmission lines and parasitic components of a transistor. Also, the carrier frequency is an example of the fundamental frequency in the input signal of the amplifier circuit.

Figure 5:
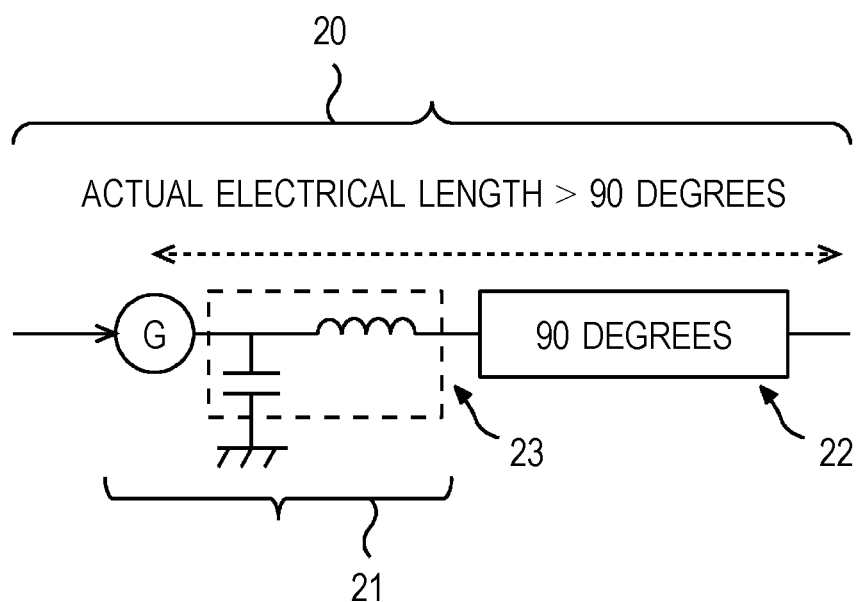
FIG. 5 is a diagram illustrating the electrical length including the parasitic component of the transistor.

However, there are cases when the presence of the parasitic components (parasitic inductance and parasitic capacitance) cannot be ignored in the carrier frequency. In FIG. 5, a branch 20 of the circuit presenting the transistor 21 as an idealistic transistor G (idealistic current source) and a parasitic component 23 is illustrated. In cases when the total electrical length of the transistor 21 and the transmission line 22 need to be approximately 90 degrees (approximately λ/4), the actual electrical length exceeds the intended values due to the parasitic component 23. In such cases, the efficiency of the amplifier circuit may suffer.

Figure 6:
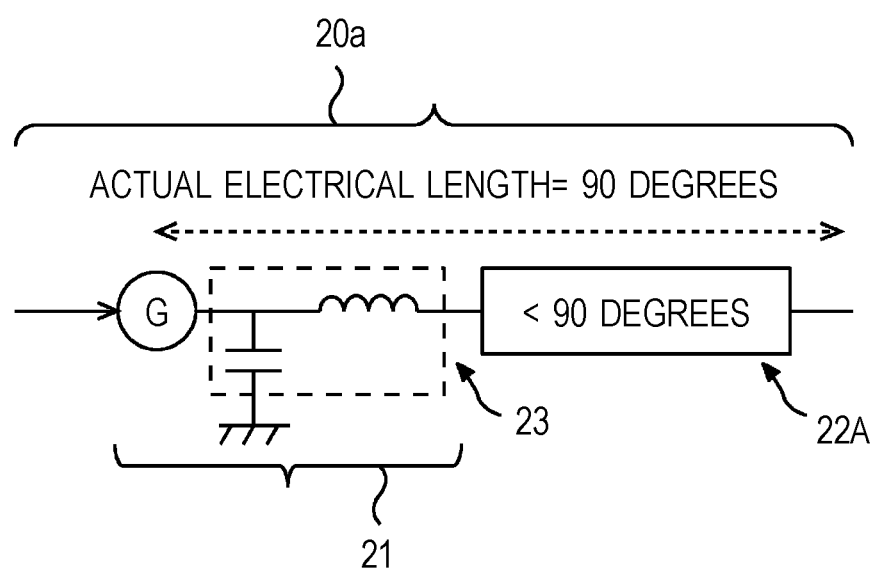
FIG. 6 is a diagram illustrating an example where the sum of the electrical length of the parasitic component of the transistor and the electrical length of the transmission line is configured to λ/4.

Therefore, as shown in the branch 20a of FIG. 6, transmission line 22A with an electrical length less than 90 degrees is connected to the transistor 21 in series. The electrical length of the transmission line 22A is designed to ensure that the sum of the electrical length of transmission line 22A and the parasitic component 23 equals to approximately 90 degrees. By using the transmission line 22A, the electrical length between the intrinsic region of the transistor (idealistic transistor) and the load is configured to idealistic values. Thus, operation of the circuit as an idealistic Doherty amplifier becomes possible.

In the example above, the electrical length of the branch was configured to approximately 90 degrees (approximately λ/4) to enable operation as a Doherty amplifier. However, the electrical length of the branch can be configured to different values. For example, the electrical length of the branch can be configured to approximately 90*n degrees. Here, n are odd integers (1, 3, 5, 7, . . . ).

Figure 7:
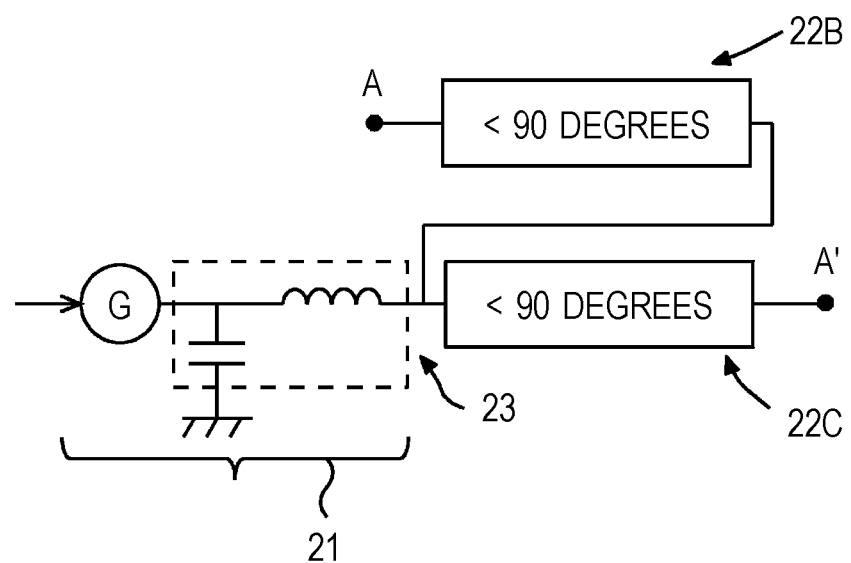
FIG. 7 is a diagram illustrating an example where the electrical length of the transmission line is designed considering the parasitic component of the transistor.

FIG. 7 illustrates part of the circuit. For idealistic operation of the circuit, the electrical length between the idealistic transistor G and the terminal A via the transmission line 22B needs to be approximately 90 degrees. Similarly, the electrical length between the idealistic transistor G and the terminal A' via the transmission line 22C needs to be approximately 90 degrees.

Also, the electrical length between terminals A and A' needs to be approximately 180 degrees. However, due to the parasitic components of the circuit, the electrical length of transmission line 22B and transmission line 22C are less than 90 degrees. Therefore, the electrical length between terminals A and A' will not be equal to approximately 180 degrees, preventing the operation as an idealistic Doherty amplifier.

Figure 8:
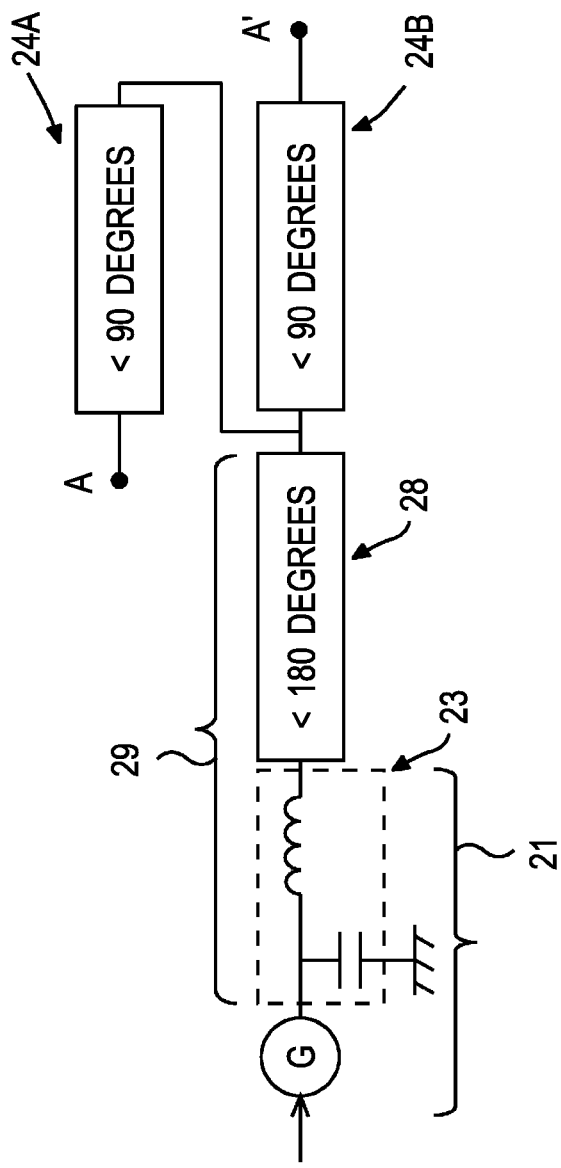
FIG. 8 is a diagram illustrating an example where a transmission line with electrical length of approximately 180 degrees is connected.

Therefore, as illustrated in FIG. 8, a transmission line 28 is connected to the output side of the parasitic component (output terminal of the transistor). The transmission line 28 is configured to ensure that the sum of the electrical length of the transmission line 28 itself and the electrical length of the parasitic component of the transistor is equal to approximately 180 degrees. Also, the transmission lines 22B and 22C in FIG. 7 are replaced with the impedance converters 24A and 24B. The impedance converters 24A and 24B are not connected directly to the output terminal of the transistor. In the designs of the impedance converters 24A and 24B, the electrical length of the parasitic component 23 do not need to be considered. Therefore, the electrical lengths of the impedance converters 24A and 24B can be configured to approximately 90 degrees. By using the configuration of FIG. 8, the electrical length between terminals A and A' can be configured to approximately 180 degrees, satisfying the requirement for idealistic operation of the circuit.

Next, an example of an amplifier circuit with a plurality of branches connected in parallel is explained. In the following, field-effect transistors are used as the transistor. Also, the gate terminal is used as the input terminal of the transistor.

Figure 9:
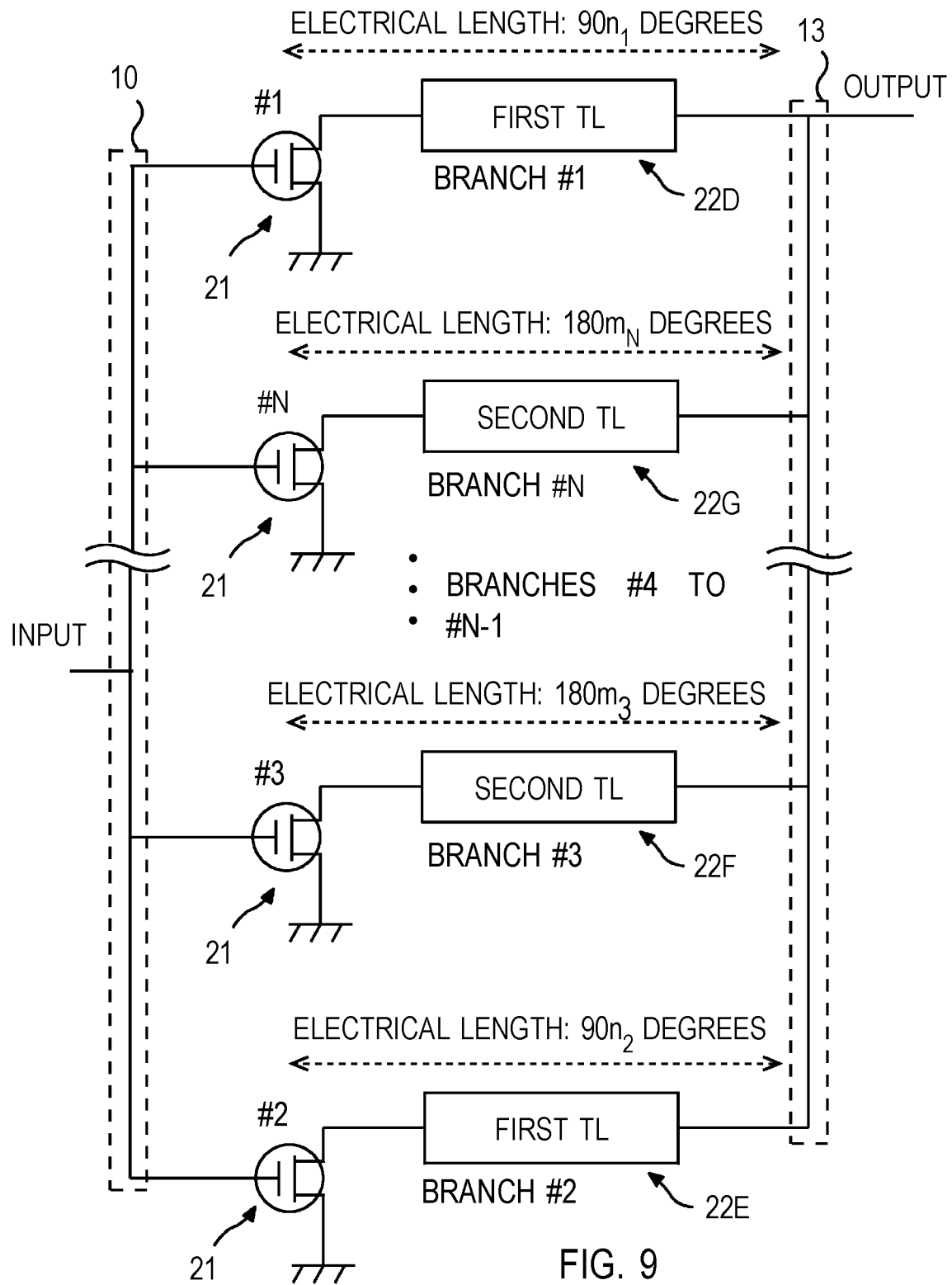
FIG. 9 is a diagram illustrating a configuration example of an amplifier circuit including a plurality of branches.

FIG. 9 is a diagram illustrating a configuration example of an amplifier circuit including a plurality of branches. The amplifier circuit of FIG. 9 includes a splitter 10, a plurality of branches (branches #1 to #N) and a combiner 13. Branch #1 includes a transistor 21 connected in the input side and a first transmission line (first TL) 22D connected to the output terminal of the transistor 21. Branch #2 includes a transistor 21 connected in the input side and a first transmission line 22E connected to the output terminal of the transistor 21. Branches #3 to #N each include a transistor 21 connected in the input side and a second transmission line (second TL) connected to the output terminal of the transistor 21. In FIG. 9 and the later figures, "TL" is an abbreviation of "transmission line".

For example, branch #3 includes a second transmission line 22F. Branch #N includes a second transmission line 22G. Here, N is an integer equal to or greater than 3. The combiner 13 combines the signals entered from the first branches (branch #1 and #2) and the second branches (branches #3 to #N). The combiner 13 provides the combined signal to circuits in the following stages, from the output terminal.

The numbers assigned to each of the transistors 21 are equal to the numbers assigned to the branches each of the transistors 21 are located. For example, transistor 21 located in branch #1 is transistor #1. Transistor 21 located in branch #2 is transistor #2. As indicated in FIG. 3, the gate DC voltages $V_{GS1}$ to $V_{GSN}$ applied to each of the transistors are configured to different values. Therefore, if the AC voltage of the input signal $v_G$ satisfies the relation $V_G<V_{TH}-V_{GS2}$, only the transistor #1 amplifies the signal. However, as the voltage of the input signal increases, new transistors join the group of transistors amplifying the signal in the order of the number assigned to each of the transistors (transistor #2, #3, #4, . . . ). As mentioned above, there may be variations in the threshold voltage $V_{TH}$ even in cases where the same type of transistors is used. Thus, the variations in the threshold voltage $V_{TH}$ can be considered in the configuration of the DC voltage applied to the gate terminals. Also, for cases when transistors of different types are used, the variations in the threshold voltage $V_{TH}$ can be considered in the configuration of the DC voltage applied to the gate terminals.

In branches #1 and #2, the sum of the electrical length for the parasitic component of transistor 21 and the electrical length of the first transmission line is equal to approximately 90*n degrees. Here, n are odd integers (1, 3, 5, 7, . . . ). The coefficient $n_1$ for the electrical length of the branch #1 and the coefficient $n_2$ for the electrical length of the branch #2 do not need to be equal values. Thus, the electrical length of branch #1 and the electrical length of branch #2 can be different. The electrical length of the first transmission lines can be determined to ensure that the electrical lengths of the branches #1 and #2 are equal to approximately 90*n degrees, where n are odd integers (1, 3, 5, 7, . . . ). Also, regardless of the electrical lengths of branch #1 and branch #2, the implementation of the first transmission lines can be different. For example, the first transmission lines may use different elements or different circuit patterns. Also, the types and geometric designs of the transistors used in branches #1 and #2 can be different. If the types of transistors or the geometric designs of the transistors are different, the parasitic components for each of the transistor vary. Therefore, the implementation of the first transmission lines in each branch can be designed depending on the transistor used in each transmission line.

In branches #3 to #N, the sum of the electrical length for the parasitic component of transistor 21 and the electrical length of the first transmission line is equal to approximately 180*m degrees. Here, m are positive integers (1, 2, 3, 4, 5, . . . ). The coefficients $m_3$, $m_4$, . . . , $M_N$ for each of the branches do not need to be equal values. Thus, the electrical lengths of the branches #3 to #N can be different values. The electrical length of the second transmission lines can be determined to ensure that the electrical lengths of the branches #3 to #N are equal to approximately 180*m degrees, where m are positive integers (1, 2, 3, 4, 5, . . . ). Also, regardless of the electrical lengths of branches #3 to branch #N, the implementation of the second transmission lines can be different.

In the following, first branches are branches whose sums of the electrical length for the parasitic component of the transistor 21 and the electrical length of the first transmission line is equal to approximately 90*n degrees, where n are odd integers (1, 3, 5, 7, . . . ). Examples of the first branch include branches #1 and #2. In the following, second branches are branches whose sum of the electrical length for the parasitic component of the transistor 21 and the electrical length of the second transmission line is equal to approximately 180*m degrees, where m are positive integers (1, 2, 3, 4, 5, . . . ). Examples of the second branch include branches #3 to #N.

Thus, the amplifier circuit according to the embodiment includes N (N>=3) transistors 21 connected in parallel. The amplifier circuit includes two first branches and N−2 second branches. The two first branches each include a transistor 21 and a first transmission line which is connected to the output terminal of the transistor 21. The N−2 second branches each include a transistor 21 and a second transmission line which is connected to the output terminal of the transistor 21. For each of the first branches, the sum between the electrical length of the parasitic component of the transistor 21 and the electrical length of the first transmission line are odd multiples of approximately 90 degrees. For each of the second branches, the sum between the electrical length of the parasitic component of the transistor 21 and the electrical length of the second transmission line are multiples of approximately 180 degrees.

As mentioned in the above description of FIG. 3, the DC voltage applied to the input terminal (gate terminal) for each of the transistors 21 can be configured to different values. For example, the DC voltage applied to the input terminal (gate terminal) can be configured to values descending in the order of: the transistor 21 of branch #1, the transistor 21 of branch #2 and the transistor 21 of branch #3. In this case, the size of the conduction angle becomes smaller in the order of: the transistor 21 of branch #1, the transistor 21 of branch #2 and the transistor 21 of branch #3. The bias becomes deeper in the order of: the transistor 21 of branch #1, the transistor 21 of branch #2 and the transistor 21 of branch #3.

Thus, DC voltages applied to input terminals for each of the transistors can be configured to different values. The DC voltages applied to the input terminals of the transistors in the second branches can be configured to a value lower than the DC voltages applied to the input terminals of the transistors in the first branches. If the transistors are field-effect transistors, the above input terminals can be gate terminals.

By using the above configuration, the circuit operates as an efficient Doherty amplifier. The amplifier circuit of the embodiment improves the power efficiency. The transistors used in each of the branches can be the same type or different types. The splitter 10 can split the electric power equally to each of the branches. Also, splitter 10 can split the electric power unequally to different branches. The splitter can be an on-chip splitter implemented in an IC. Also, the splitter can be implemented outside of an IC. Similarly, the combiner can be an on-chip combiner implemented in an IC. Also, the combiner can be implemented outside of an IC.

The configuration of the first transmission lines in branch #1 and branch #2 can be similar. Also, the configuration of the first transmission lines in branch #1 and branch #2 can be different. The configuration of the second transmission lines in branches #3 to #N can be similar. Also, the configuration of the second transmission lines in branches #3 to #N can be different. Also, circuits or elements which convert the impedance can be connected between the input of the transistor 21 and the splitter.

Figure 10:
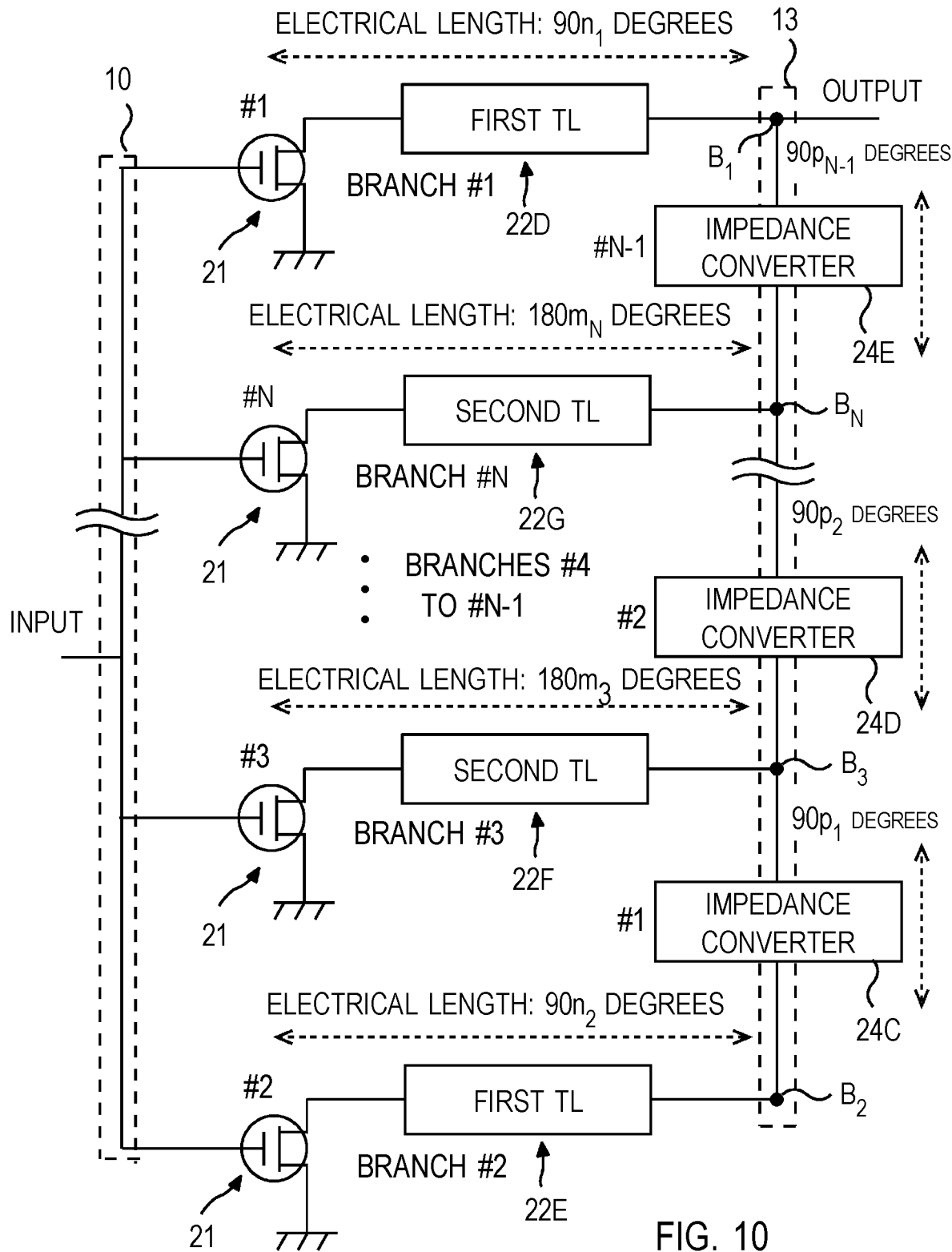
FIG. 10 is a diagram illustrating a first configuration example of an amplifier circuit including impedance converters.

FIG. 10 is a diagram illustrating a first configuration example of an amplifier circuit including impedance converters. In the amplifier circuit of FIG. 10, each of the impedance converters (#1 to #N−1) are connected between the terminals $B_i$ (i=1, 2, 3, ..., N) in the output side of the branches #i.

Specifically, impedance converter #1 (impedance converter 24C) is connected between terminals $B_2$ and $B_3$. Impedance converter #N−1 (impedance converter 24E) is connected between terminals $B_1$ and $B_N$. Impedance converter #2 (impedance converter 24D) is connected between terminals $B_3$ and $B_4$ (not illustrated). In the amplifier circuit of FIG. 10, a plurality of impedance converters are connected in series.

The electrical length of impedance converters #1 to #N−1 are configured to odd multiples of approximately 90 degrees (90*p, p=1, 3, 5, 7, ...). The coefficients $p_1, p_2, \ldots, p_{N-1}$ do not need to be equal values. Therefore, the electrical lengths of the impedance converters can be configured to the same values or different values.

Thus, the amplifier circuit according to the embodiment can include an impedance converter connected between the output terminals of the second branches or between the output terminal of either of the first branches and the output terminal of a second branch. The electrical length of the impedance converter is an odd multiple of approximately 90 degrees. In the amplifier circuit according to the embodiment, the impedance converters do not need to be connected between all the output terminals of the branches.

Figure 11:
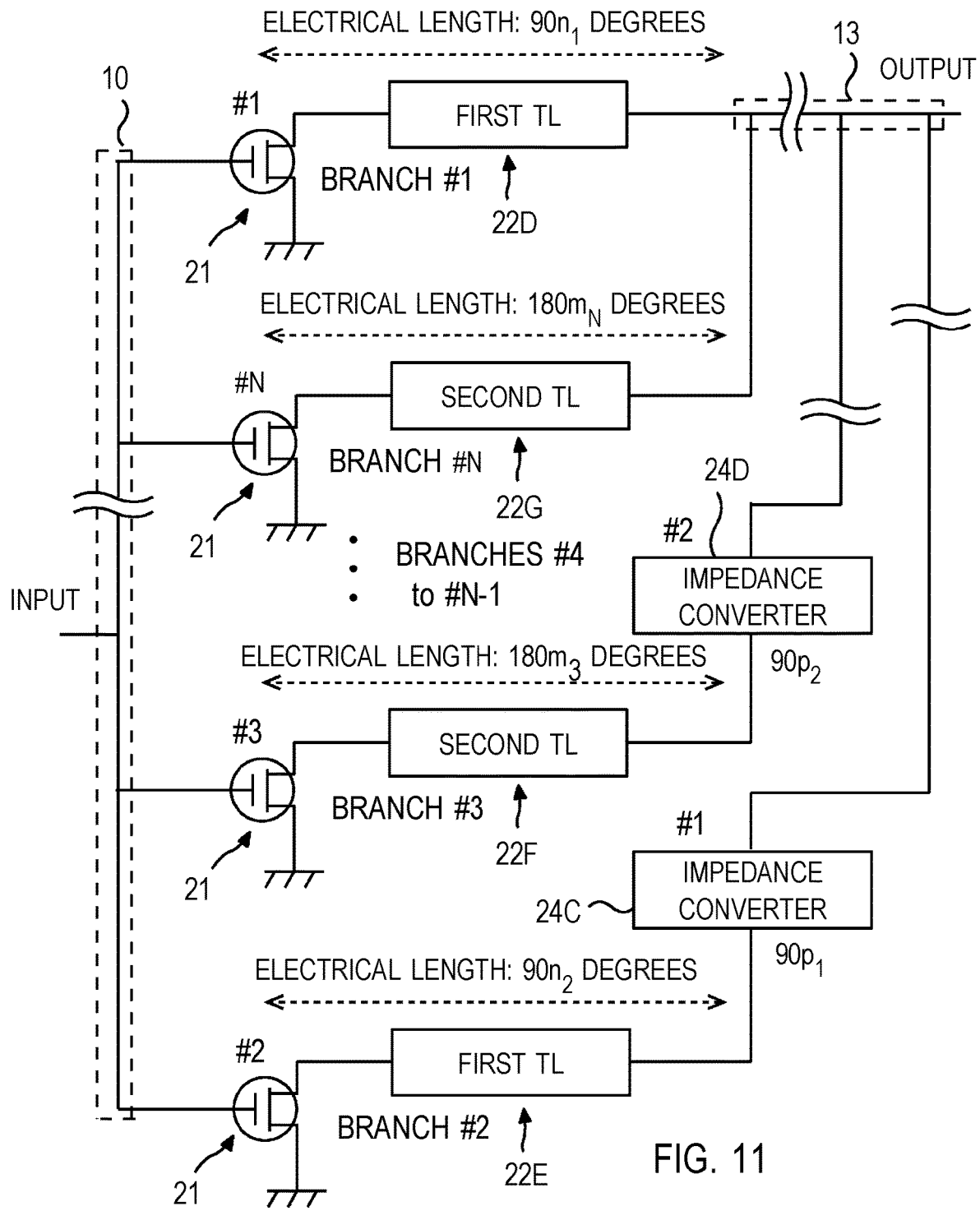
FIG. 11 is a diagram illustrating a second configuration example of an amplifier circuit including impedance converters.

FIG. 11 is a diagram illustrating a second configuration example of an amplifier circuit including impedance converters. In the amplifier circuit of FIG. 11, each of the impedance converters (for example, impedance converter #1 and #2) are connected to the output sides of the branches.

For example, in branch #2, transistor #2, first transmission line 22E and impedance converter #1 are connected in series. In branch #3, transistor #3, first transmission line 22F and impedance converter #2 are connected in series.

Impedance converters can be connected to branches which are not illustrated in FIG. 11. Also, not all the branches need to have impedance converters. Thus, an impedance converter can be connected in series, to at least either of the branches. The amplifier circuit according to the embodiment can have an impedance converter connected in series to at least either of the first transmission lines or the second transmission lines. The electrical length of the impedance converter is an odd multiple of 90 degrees.

Referring to FIG. 10 and FIG. 11, some of the first branches have an impedance converter connected between the output terminal of branch and the output terminal of the combiner. Also, some of the first branches do not have an impedance converter connected between the output terminal of branch and the output terminal of the combiner. It is possible to configure the gate terminal (input terminal) DC voltage of the transistor 21 in the first branch with an impedance converter to a value smaller than the gate terminal (input terminal) DC voltage of the transistor 21 in the first branch without an impedance converter. The gate terminal (input terminal) DC voltage of the transistor 21 in the first branch with an impedance converter connected can be configured to a value greater than the gate terminal (input terminal) DC voltage of the transistor 21 in the first branch without an impedance converter.

In the above, methods to amplify carrier frequency signals were explained. Since transistors are non-linear elements, the output signals of transistors include harmonic components besides the fundamental frequency components. By setting the impedance of the harmonic components to adequate values, the power efficiency can be improved. Also, a greater output of power can be obtained.

Figure 12:
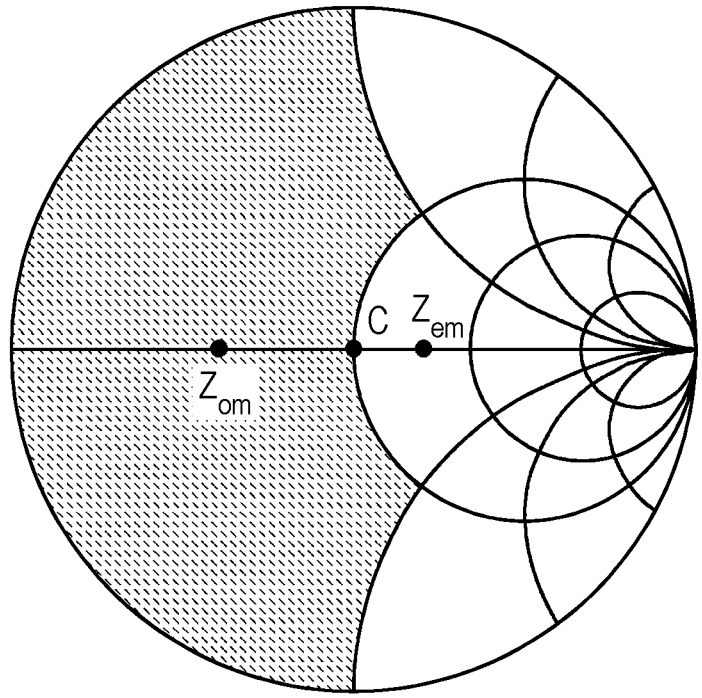
FIG. 12 is a Smith Chart representing an example of the harmonic impedance measured from intrinsic region of an idealistic transistor.

FIG. 12 is a Smith Chart representing an example of the harmonic impedance measured from the intrinsic region of an idealistic transistor. Here, an idealistic transistor is a transistor without parasitic components. FIG. 12 is indicating the impedance of the harmonic components including each of the parasitic components 23 of the transistors 21 in the branches #1 to #N and the impedance of the lines/elements connected in the load side of the transistor. For example, the impedance of the harmonic components indicated in FIG. 12 is the impedance of the harmonic components measured in the load side of the idealistic transistor G.

In the Smith Chart of FIG. 12, the region covered with a pattern is an example of the harmonic load impedance. The target load impedance including the parasitic components 23 of the transistor 21 in the carrier frequency (fundamental frequency) is $Z_{target}$. In the example of FIG. 12, the load impedance $Z_{target}$ can be configured to a value which is between the real part of the load impedance $Z_{om}$ or the load impedance $Z_{em}$. Here, the load impedance $Z_{om}$ is the load impedance when the output power of the transistor in the intrinsic region takes the maximum value in the carrier frequency (fundamental frequency). Also, the load impedance $Z_{em}$ is the load impedance when the power efficiency takes the maximum value in the carrier frequency (fundamental frequency).

In the following, the load impedance $Z_{om}$ when the output power of the transistor in the intrinsic region takes the maximum value in the carrier frequency (fundamental frequency) is called the first load impedance. Also, the load impedance $Z_{em}$ is the load impedance when the power efficiency takes the maximum value in the carrier frequency (fundamental frequency) is called the second load impedance.

For example, both the resistance component and the reactance component of the load impedance of the transistor for the harmonics in the intrinsic region can be configured to a value equal to or smaller than the first load impedance. The first load impedance is the load impedance when the output power of the transistor in the intrinsic region takes the maximum value in the fundamental frequency.

For example, both the resistance component and the reactance component of the load impedance of the transistor for the harmonics in the intrinsic region can be configured to a value equal to or smaller than the second load impedance. The second load impedance is the load impedance when the power efficiency takes the maximum value in the fundamental frequency.

For example, both the resistance component and the reactance component of the load impedance of the transistor operating in the intrinsic region for the harmonic components can be configured to a value equal to or smaller than the value between the real part of the first load impedance and the real part of the second load impedance.

In the example of FIG. 12, a case when the target load impedance $Z_{target}$ is a real number is explained. However, the target load impedance $Z_{target}$ can be a complex number with a real part and an imaginary part. The normalized impedance of the Smith Chart shown in FIG. 12 is $Z_{target}$.

The harmonic impedance of branches #1 to #N (at least either of the first branches or the second branches) including the parasitic component 23 of the transistor 21 $R_h+jI_h$ can be configured to ensure that: (1) the real part $R_h$ (resistance component) is equal to or less than the target load impedance $Z_{target}$; and (2) the absolute value of the imaginary part $I_h$ (reactance component) is equal to or less than $Z_{target}$ ($-Z_{target}<=I_h<=Z_{target}$).

The target load impedance $Z_{target}$ at each of the branches can be configured to different values. If $Z_{target}$ is a complex number, the real part $R_h$ can be configured to a value equal to or smaller than the real part of $Z_{target}$. Also, the imaginary part $I_h$ is configured to a value equal to or smaller than the real part of $Z_{target}$. The upper limits of the real part $R_h$ (resistance component) and the imaginary part $I_h$ (reactance component) of the harmonic impedances mentioned above are only examples. Therefore, the upper limits of the real part $R_h$ (resistance component) and the imaginary part $I_h$ (reactance component) of the harmonic impedances can be determined by using different criteria.

The amplifier circuit can be designed to ensure that for at least either of the first branches, a load impedance including the parasitic component 23 of the transistor 21 and the first transmission line in harmonic frequency is smaller than the load impedance for fundamental frequency.

Also, the amplifier circuit can be designed to ensure that for at least either of the second branches, a load impedance including the parasitic component 23 of the transistor 21 and the second transmission line in harmonic frequency is smaller than the load impedance for fundamental frequency.

The target impedance $Z_{target}$ can be configured by using the center point C of the Smith Chart in FIG. 12. Also, the target impedance $Z_{target}$ can be configured by using the average characteristic impedance of the first transmission line or the second transmission line. For example, if the average characteristic impedance of the first transmission line is 10 ohms, the center point C of the Smith Chart can be configured to 10 ohms. However, this is only one example of methods which can be used to determine the center point. Thus, different methods can be used to determine the center point C of the Smith Chart.

Figure 13:
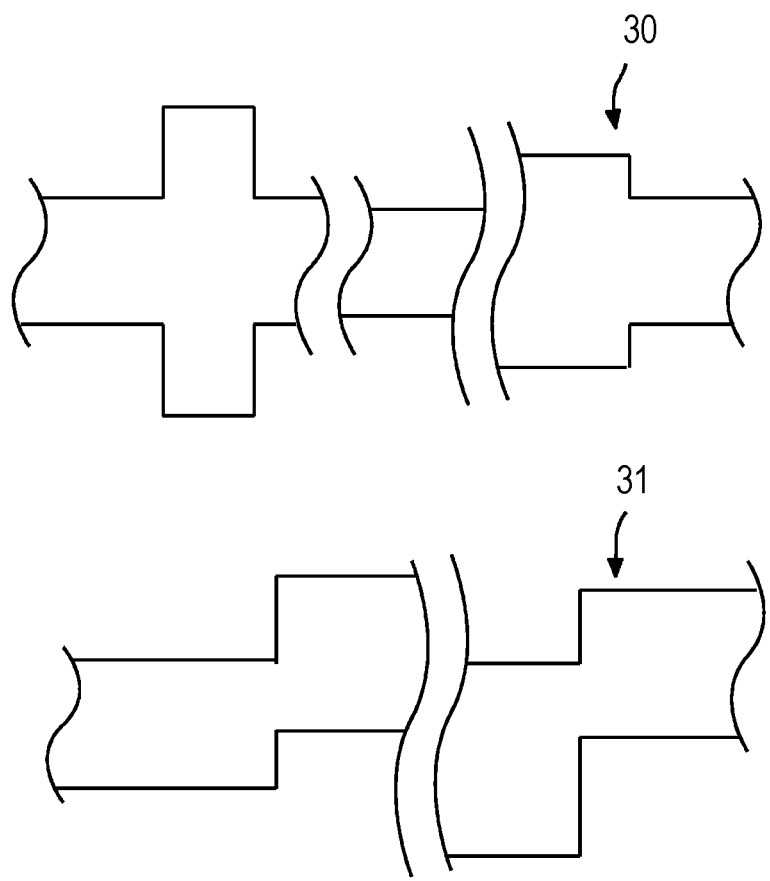
FIG. 13 is a planar view diagram illustrating examples of first transmission lines, second transmission lines and impedance converters.
Figure 14:
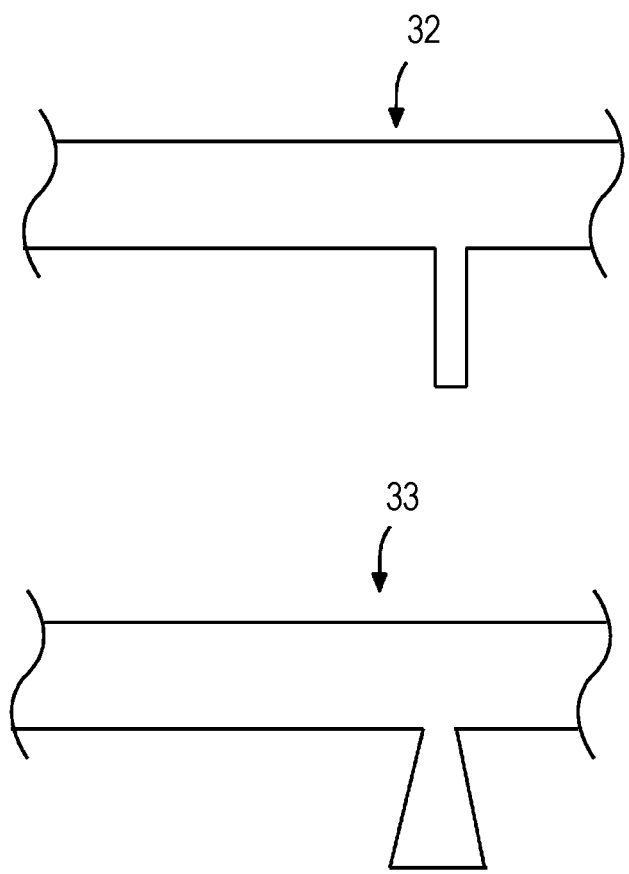
FIG. 14 is a planar view diagram illustrating examples of first transmission lines, second transmission lines and impedance converters.

Next, examples of implementations which reduce the impedance of the harmonic components are described. FIG. 13 and FIG. 14 are planar view diagrams of the first transmission line, the second transmission line and the impedance converter. The transmission line 30 of FIG. 13 includes an open stub. Thus, the width of the transmission line 30 changes in the length direction. The transmission line 31 of FIG. 13 is another example where the width is changing in the length direction. By using the transmission line 30 and 31, the impedance for harmonics (for example, second harmonics and third harmonics) can be configured to the desired values. Also, the impedance for the carrier frequency can be configured to the desired values.

The transmission lines 32 and 33 in FIG. 14 each include open stubs. The length of the open stub can be configured to approximately λ/4 of the electrical length of the harmonic components (for example, second harmonics and third harmonics) of the carrier frequency. Therefore, the transmission line has similar characteristics as cases when the transmission line is short-circuited for harmonic components. An inductor can be connected between a separate bias circuit and the open stub. In this case, the open stub can be used as a part of the bias circuit. Also, the open stub can be connected to a bias circuit without connecting an inductor, using the open stub as a part of the bias circuit. The open stub can be a radial stub.

Figure 15:
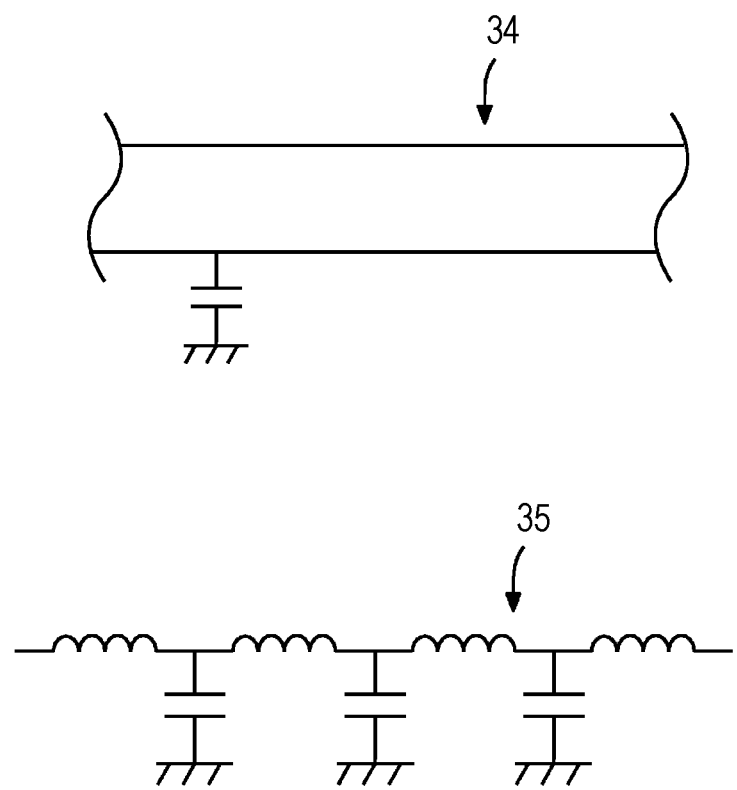
FIG. 15 is a planar view diagram illustrating examples of first transmission lines, second transmission lines and impedance converters.

FIG. 15 is a planar view diagram illustrating examples of the first transmission lines, second transmission lines and impedance converters. In the transmission line 34, a capacitor is connected between the transmission line and the ground. The transmission line 35 includes cascaded inductors. Also, capacitors are connected between the transmission line 35 and the ground at a plurality of points.

Transmission lines 30 to 35 in FIG. 13 to FIG. 15 are examples of implementations which reduce the impedance for the harmonic components. The implementations shown in transmission lines 30 to 35 can be combined. Also, other types of transmission lines can be used. Examples of transmission lines include coplanar waveguides, slotline transmission lines, stripline transmission lines and micro stripline transmission lines or a combination of the above. However, any type of transmission line can be used.

All the first transmission lines, second transmission lines and impedance converters do not have to include the aforementioned implementations for reducing the impedance at the harmonic components. At least either of the first transmission lines, second transmission lines and impedance converters may include the aforementioned implementations for reducing the impedance at the harmonic components.

For example, only the first transmission line can include implementations for reducing the impedance at the harmonic components. Also, only the second transmission line can include implementations for reducing the impedance at the harmonic components. Only the impedance converter can include implementations for reducing the impedance at the harmonic components. Part of the first transmission lines, second transmission lines and impedance converters may include the aforementioned implementations for reducing the impedance at the harmonic components.

In the amplifier circuit according to the embodiment, at least either of the first transmission lines, second transmission lines and impedance converters can include at least either coplanar waveguides, slotline transmission lines, stripline transmission lines, micro stripline transmission lines, open stubs, transmission lines with widths changing stepwise in the length direction, capacitors connected between the ground and cascaded inductors.

Second Embodiment

In the first embodiment, the configuration of an amplifier circuit which amplifies signals with large fluctuations in the signal amplitude was described. However, the configuration of the amplifier circuit is not limited to the first embodiment. Other configuration examples of the amplifier circuit are described in the second embodiment.

Figure 16:
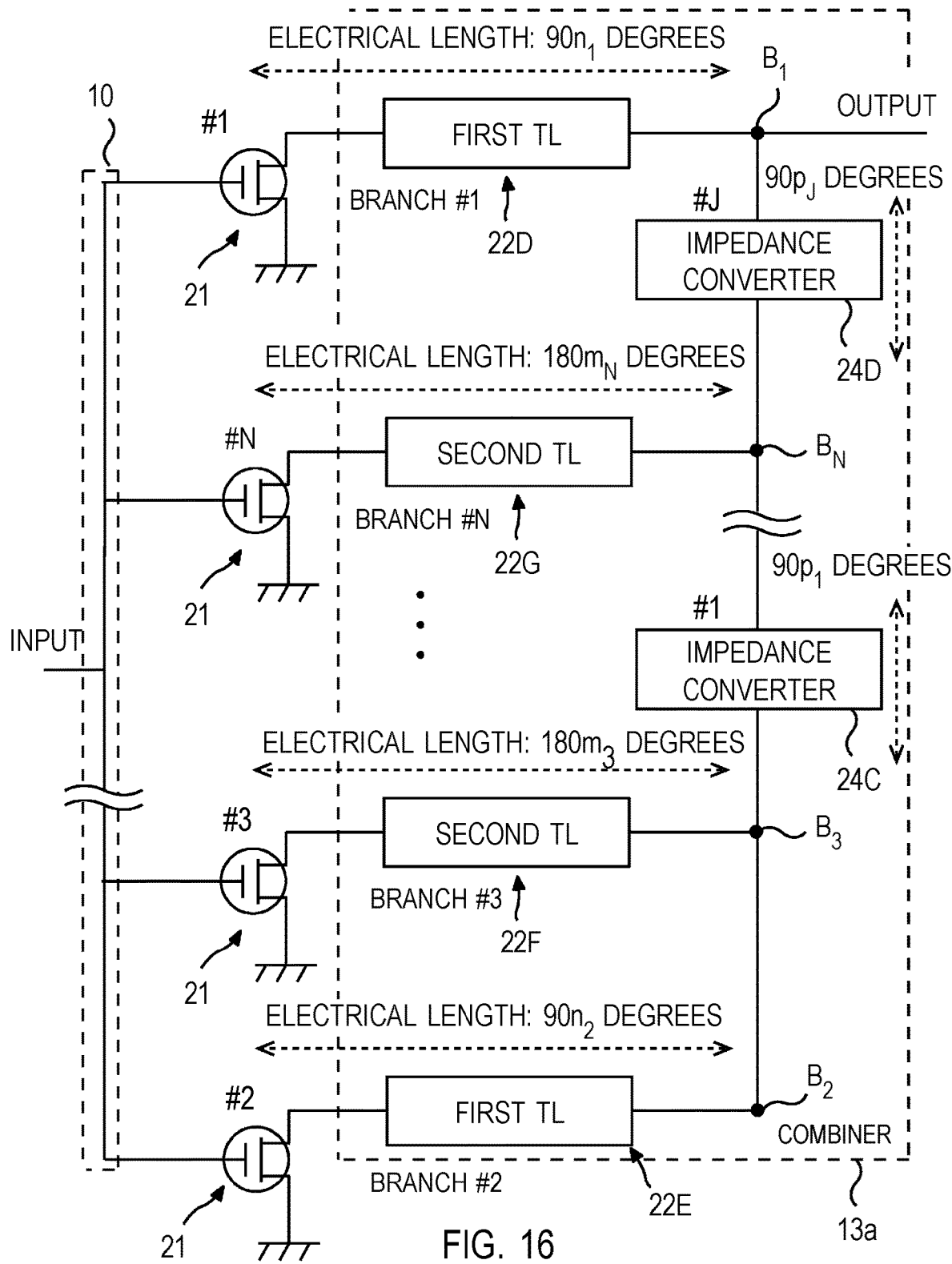
FIG. 16 is a diagram illustrating a configuration example of a generalized amplifier circuit.

FIG. 16 is a diagram illustrating a configuration example of a generalized amplifier circuit. In the amplifier circuit of FIG. 16, impedance converters #1 to #J are connected between the terminals $B_i$ (i=1, 2, 3, ..., N) located in the output side of each branch #i. However, different from the example of FIG. 10, impedance converters are not connected between the terminal $B_2$ and the terminal $B_3$. The impedance converters may be missing in the connection between an output side of the first branch with second lowest DC voltage applied to the input terminal (gate terminal) of the transistor 21 and the output side of the second branch with third lowest DC voltage applied to the input terminal (gate terminal) of the transistor 21. Here, J is the number of impedance converters. Here, the relation J=N-2 holds.

In the amplifier circuit of FIG. 16, the combiner 13a includes the first transmission line, the second transmission line and the impedance converter 24. Thus, the first transmission line, the second transmission line and the impedance converter 24 can be formed in the combiner. However, not all the first transmission lines, second transmission lines and impedance converters need to be formed in the combiner. For example, at least either of the first transmission lines, second transmission lines and impedance converters can be formed in the combiner. Also, all the first transmission lines, second transmission lines and the impedance converters can be formed separately from the combiner.

The configuration of the other parts of the amplifier circuit are similar to the amplifier circuit according to the first embodiment (for example, FIG. 10). Thus, the DC voltage of the gate terminals of the transistors are descending in the order of transistor #1, #2, #3, ..., and #N. Also, the electrical lengths of the first transmission line, the second transmission line and the impedance converter are similar to the amplifier circuit according to the first embodiment.

Figure 17:
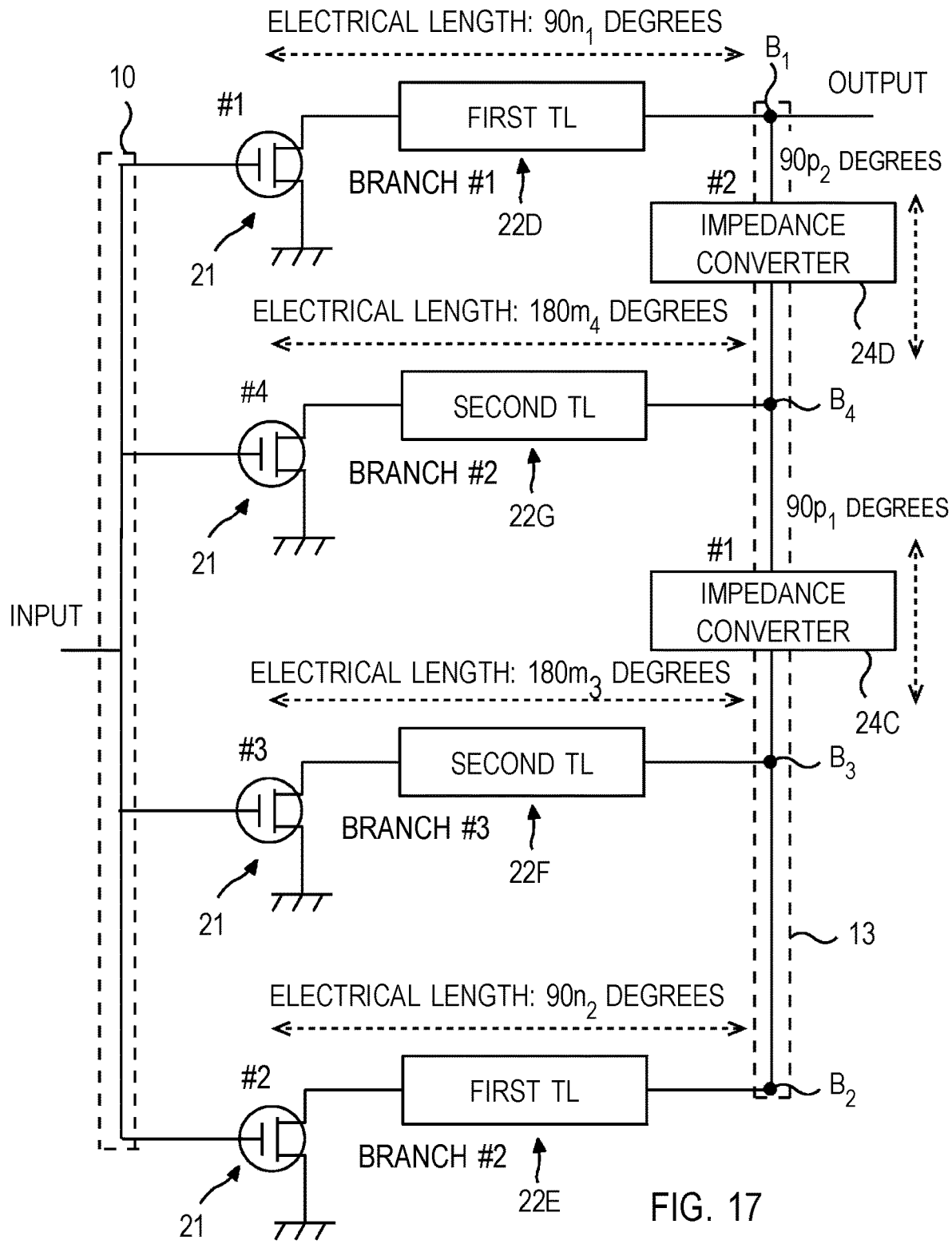
FIG. 17 is a diagram illustrating a configuration example of an amplifier circuit including four branches.

The amplifier circuit of FIG. 16 includes N branches and N−2 (J) impedance converters. In each of the two branches (#1, #2), the transistor 21 and the first transmission line are connected in series. In each of the N−2 branches, the transistor 21 and the second transmission line are connected in series. Here, N is a integer equal to or greater than 3. FIG. 17 illustrates an configuration example of the amplifier circuit when N=4. N can be any number as long as it is a integer equal to or greater than 3.

In the first embodiment, for the branches #1 and #2, the sum of the electrical length of the parasitic component of the transistor 21 and the electrical length of the first transmission line were odd multiples of approximately 90 degrees (90*n, n=1, 3, 5, 7, ...). Also, for the branches #3 to #N, the sum of the electrical length of the parasitic component of the transistor 21 and the electrical length of the second transmission line were multiples of approximately 180 degrees (180*m, m=1, 2, 3, 4, ...). The electrical lengths of the impedance converters #1 to #N−1 were configured to odd multiples of approximately 90 degrees (90*p, p=1, 3, 5, 7, ...).

The electrical lengths of the first transmission line, the second transmission line and the impedance converter can be configured to the minimum values. Thereby, the required implementation space, manufacturing costs and effects of noise can be reduced for the amplifier circuit.

Figure 18:
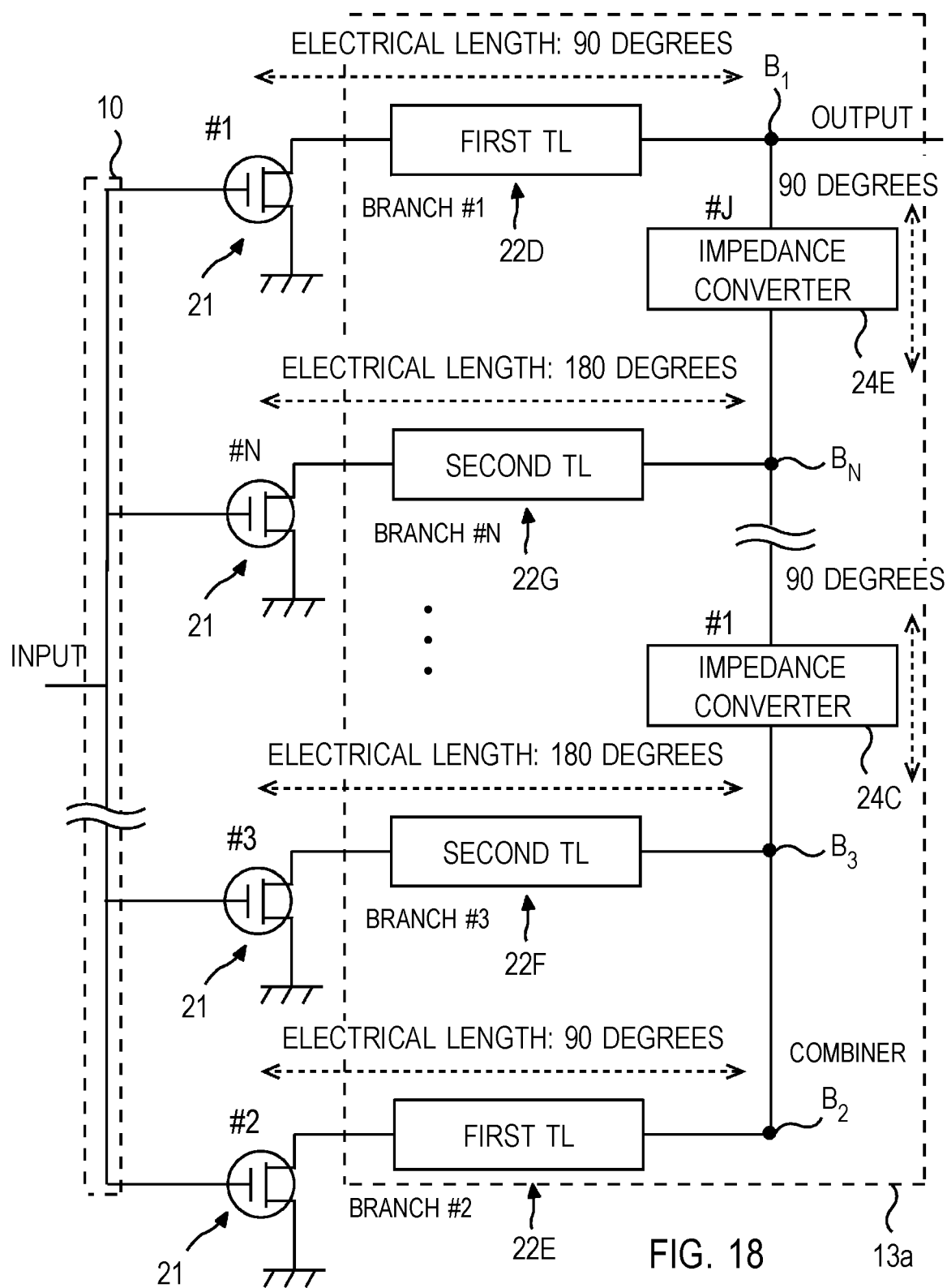
FIG. 18 is a diagram illustrating a configuration example of an amplifier circuit with shorter electrical lengths at the first transmission lines, the second transmission lines and the impedance converters.

FIG. 18 is a diagram illustrating a configuration example of an amplifier circuit with shorter electrical lengths at the first transmission lines, the second transmission lines and the impedance converters. In the example of FIG. 18, the electrical lengths for all the impedance converters 24 are configured to approximately 90 degrees (approximately $\lambda/4$). In the branches #1 and #2, the sum of the electrical length of the parasitic component of the transistor 21 and the electrical length of the first transmission line is configured to approximately 90 degrees (approximately $\lambda/4$). In the branches #3 to #N, the sum of the electrical length of the parasitic component of the transistor 21 and the electrical length of the second transmission line is configured to approximately 180 degrees (approximately $\lambda/2$).

Figure 19:
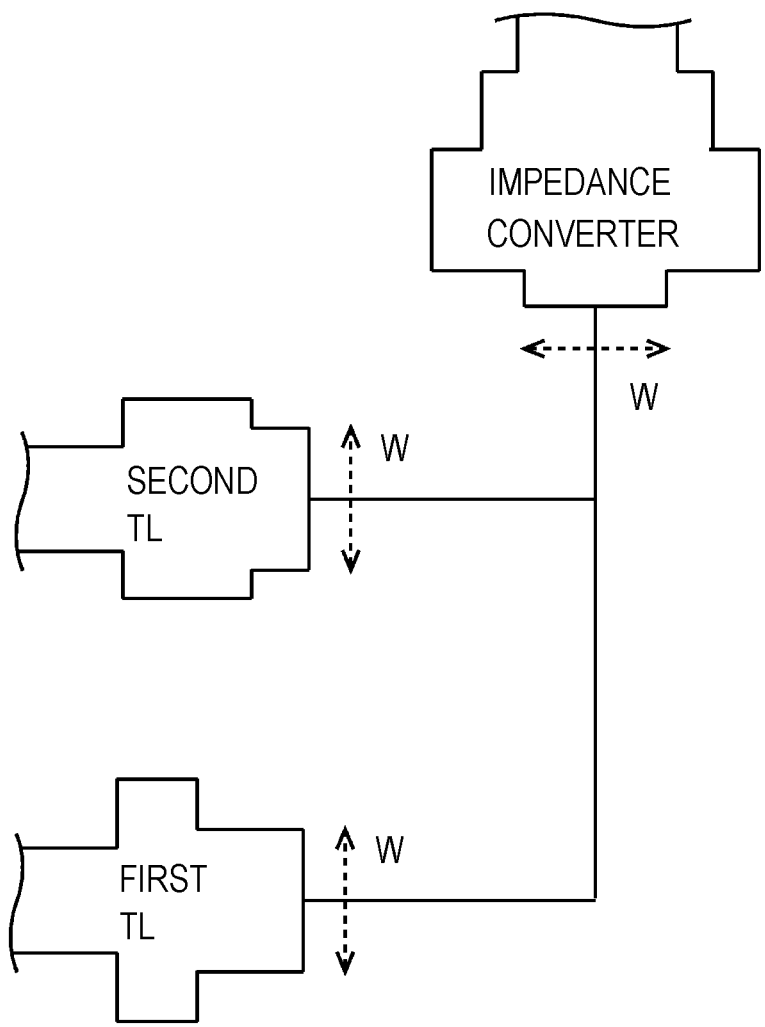
FIG. 19 is a diagram illustrating a configuration example where the widths of the output sides of the first transmission line, the second transmission line and the impedance converter are equal.

FIG. 19 is a diagram illustrating a configuration example where the widths of the output sides of the first transmission line, the second transmission line and the impedance converter are equal. By using the configuration illustrated in FIG. 19, it is possible to make the implementation of the amplifier circuit easier and simpler. The widths of the first transmission lines, the second transmission lines and the impedance converters at the edges connected to the output terminal $B_i$ (i is an integer from 1 to N) can be configured uniformly to $W_i$. However, the values of $W_i$ and $W_j$ (j is an integer from 1 to N which is different from i) can be different.

Figure 20:
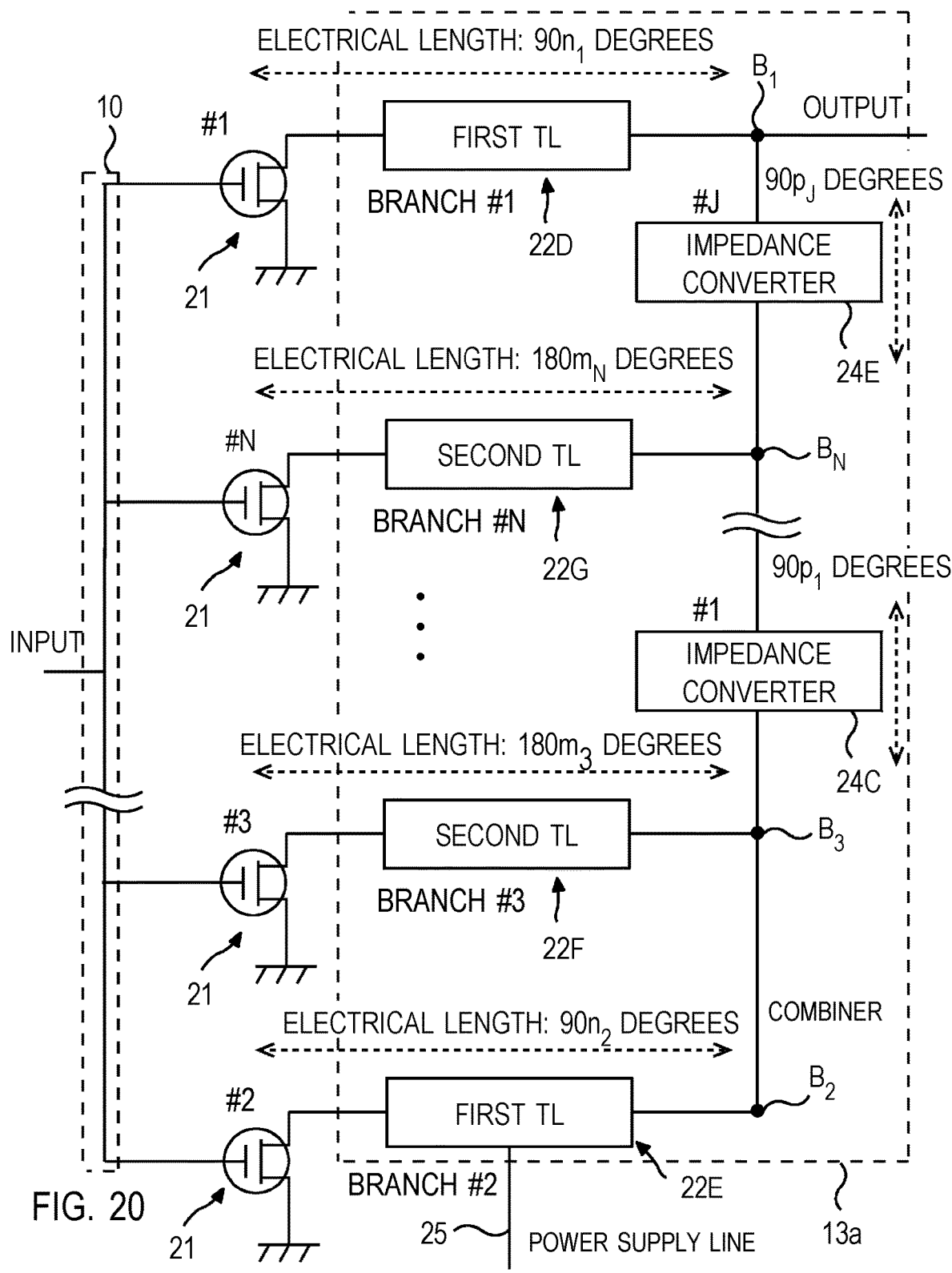
FIG. 20 is a diagram illustrating a first configuration example of an amplifier circuit with a power supply line connected to the combiner.

FIG. 20 is a diagram illustrating a first configuration example of an amplifier circuit with a power supply line connected to the combiner. In the amplifier circuit of FIG. 20, a power line 25 is connected to the first transmission line 22E of branch #2. The power line 25 is connected to a DC power supply. The power line 25 provides electrical power to the amplifier circuit.

Figure 21:
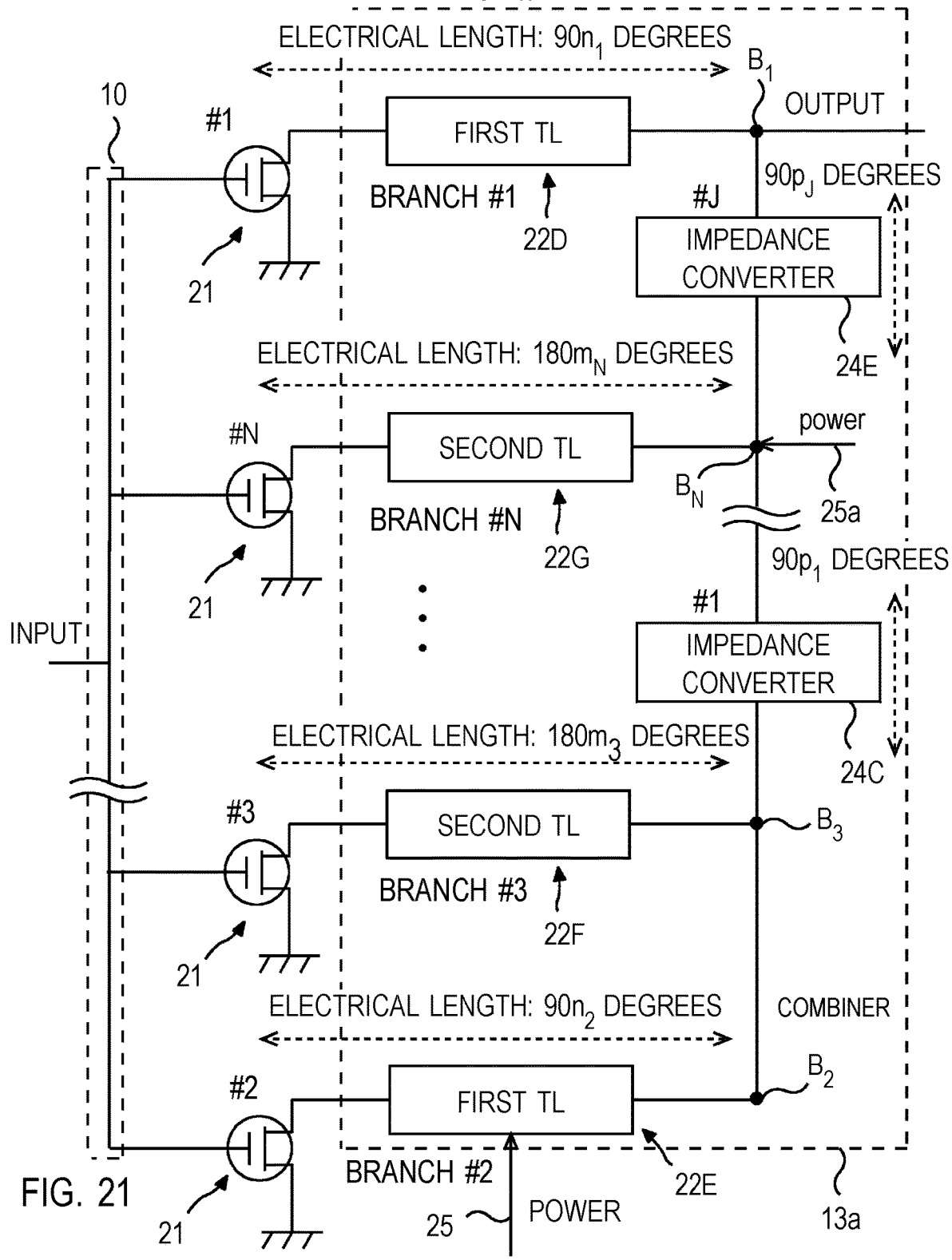
FIG. 21 is a diagram illustrating a second configuration example of an amplifier circuit with a power supply line connected to the combiner.

FIG. 21 is a diagram illustrating a second configuration example of an amplifier circuit with a power supply line connected to the combiner. In the amplifier circuit of FIG. 21, a power line 25 is connected to the first transmission line 22E of branch #2. Also, a power line 25a is connected to the terminal $B_N$ in the output side of the branch #N. Both the power lines 25 and 25a are connected to a DC power supply. Both the power lines 25 and 25a provide electrical power to the amplifier circuit. The power lines 25 and 25a can be implemented as circuits on the substrate (circuit board). The circuit can be implemented by combining micro stripline transmission lines, inductors and capacitors.

In the amplifier circuit according to the embodiment, the amplifier circuit can be designed with additional conditions regarding the electrical lengths between the terminals (points). In the following, an example of an amplifier circuit designed with additional conditions regarding the electrical length is described.

Figure 22:
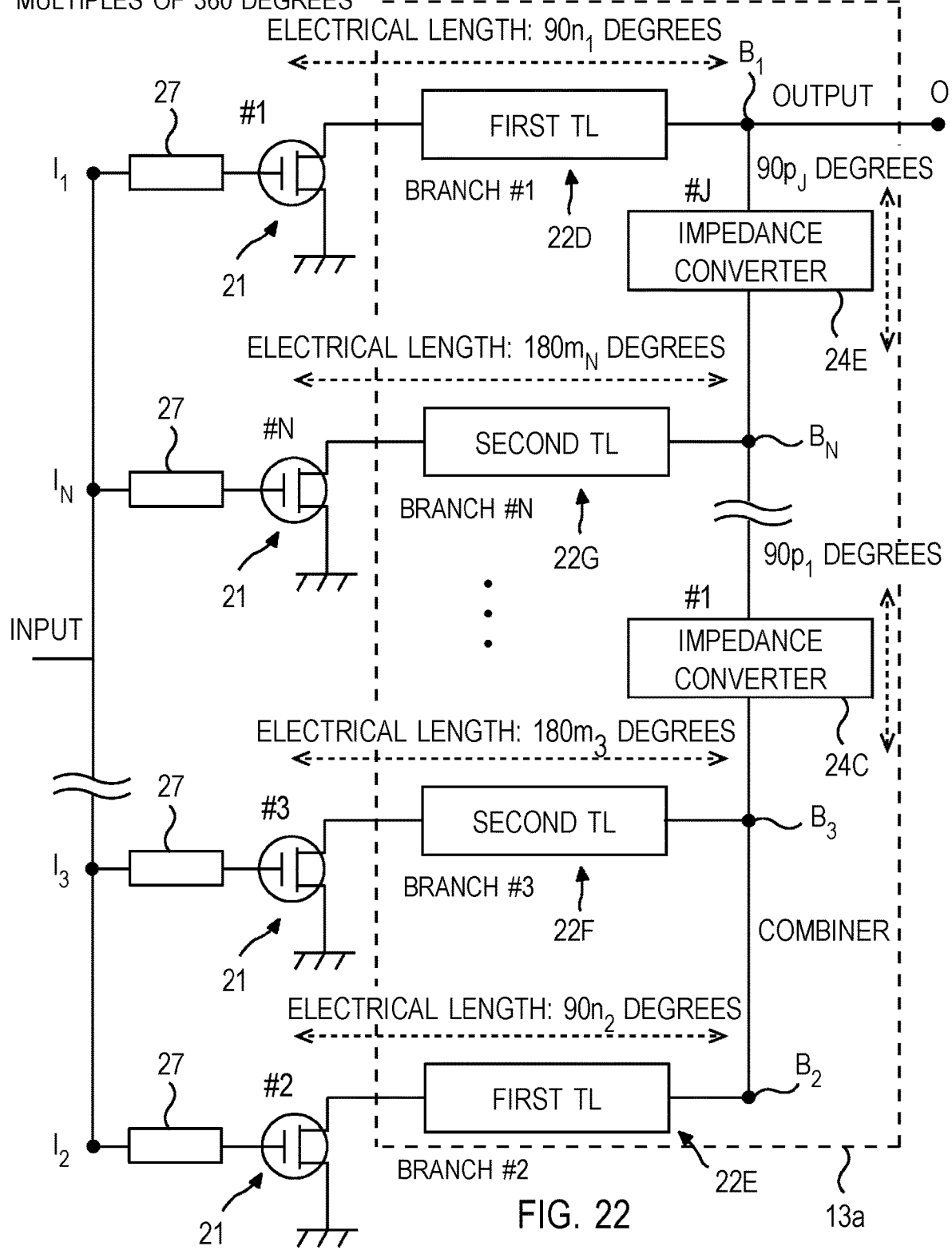
FIG. 22 is a diagram illustrating a configuration example of an amplifier circuit where the differences of the electrical lengths for each of the paths are approximately multiples of 360 degrees.

FIG. 22 is a diagram illustrating a configuration example of an amplifier circuit where the differences of the electrical lengths for each of the paths are approximately multiples of 360 degrees. In the branches #1 and #2 of the amplifier circuit in FIG. 22, an element 27, a transistor 21 and a first transmission line is connected in series. In the branches #3 to #N, an element 27, a transistor 21 and a second transmission line is connected in series. The type of element 27 is not limited. Also, the element 27 does not necessary have to be a single element. Instead, the element 27 can be a circuit block including a plurality of components connected with each other. The configuration of the remaining parts of the amplifier circuit in FIG. 22 is similar to the amplifier circuit in FIG. 16.

The terminals $I_1$, $I_2$, $I_3$, . . . and $I_N$ are located in the input side edges of each of the branches #1, #2, #3, . . . and #N in the circuit. Also, terminal O is in the output side edge of the amplifier circuit. In the following, the electrical length between two terminals in the amplifier circuit is described with the notation, EL ( . . . ). If this notation is used, the electrical length between the terminal $I_1$ and the terminal O is $EL(I_1\text{-}O)$.

The amplifier circuit of FIG. 22 is configured to ensure that the differences of the electrical lengths of the plurality of paths between the input side terminals of each branch and the output side terminal of the amplifier circuit ($EL(I_1\text{-}O)$, $EL(I_2\text{-}O)$, $EL(I_3\text{-}O)$, . . . , $EL(I_N\text{-}O)$) are multiples of approximately 360 degrees (approximately $\lambda$). Therefore, if the differences in the electrical lengths of arbitrary selected two paths are calculated, the result would be multiples of approximately 360 degrees (approximately $\lambda$).

It is possible to configure the amplifier circuit to ensure that the differences in the electrical lengths of arbitrary selected two paths are calculated, the result would be approximately 0 degrees. Thus, it is possible to configure the amplifier circuit to ensure that the differences in the electrical lengths of arbitrary selected two paths are calculated, the result would be approximately 0 degrees or multiples of approximately 360 degrees (approximately $\lambda$).

In the circuit of FIG. 22, it is possible to adjust the impedance of the elements 27 in each of the branches to ensure that the above conditions for electrical lengths are satisfied. Therefore, the electrical lengths (impedances) of the elements 27 in each of the branches can be configured to different values. Also, not all the branches need to have elements 27. Thus, it is possible to use transmission lines, patterns or components other than the element 27 to adjust the electrical lengths between terminals $I_i$ and O (i=1, 2, 3, . . . and N). Also, the differences in the electrical lengths of the paths can be values other than approximately 0 degrees or multiples of approximately 360 degrees (approximately $\lambda$).

For example, in the amplifier circuit according to the embodiment, the differences of electrical lengths for a plurality of paths between the input side terminal of the first branch and the output terminal of the combiner can be approximately 0 degrees or multiples of approximately 360 degrees (approximately $\lambda$). Here, the electrical length of a path between the input side terminal of the first branch and the output terminal of the combiner is called the first electrical length.

Also, in the amplifier circuit according to the embodiment, the differences of electrical lengths for a plurality of paths between the input side terminal of the second branch and he output terminal of the combiner can be approximately 0 degrees or multiples of approximately 360 degrees (approximately $\lambda$). Here, the electrical length of a path between the input side edge (terminal) of the second branch and the output terminal of the combiner is called the second electrical length.

In the amplifier circuit according to the embodiment, the differences of electrical lengths between either of the first electrical lengths and either of the second electrical lengths can be approximately 0 degrees or multiples of approximately 360 degrees (approximately $\lambda$).

In the amplifier circuit according to the embodiment, the differences of electrical lengths between the first electrical lengths can be multiples of approximately 360 degrees (approximately $\lambda$) plus an arbitrary degrees with an absolute value which is equal to or smaller than 30 degrees. Here, the multiples of approximately 360 degrees include approximately 0 degrees.

In the amplifier circuit according to the embodiment, the differences of electrical lengths between the second electrical lengths can be multiples of approximately 360 degrees (approximately $\lambda$) plus an arbitrary degrees with an absolute value which is equal to or smaller than 30 degrees. Here, the multiples of approximately 360 degrees include approximately 0 degrees.

In the amplifier circuit according to the embodiment, the differences of electrical lengths between either of the first electrical lengths and either of the second electrical lengths can be multiples of approximately 360 degrees (approximately $\lambda$) plus an arbitrary degrees with an absolute value which is equal to or smaller than 30 degrees. Here, the multiples of approximately 360 degrees include approximately 0 degrees.

Figure 23:
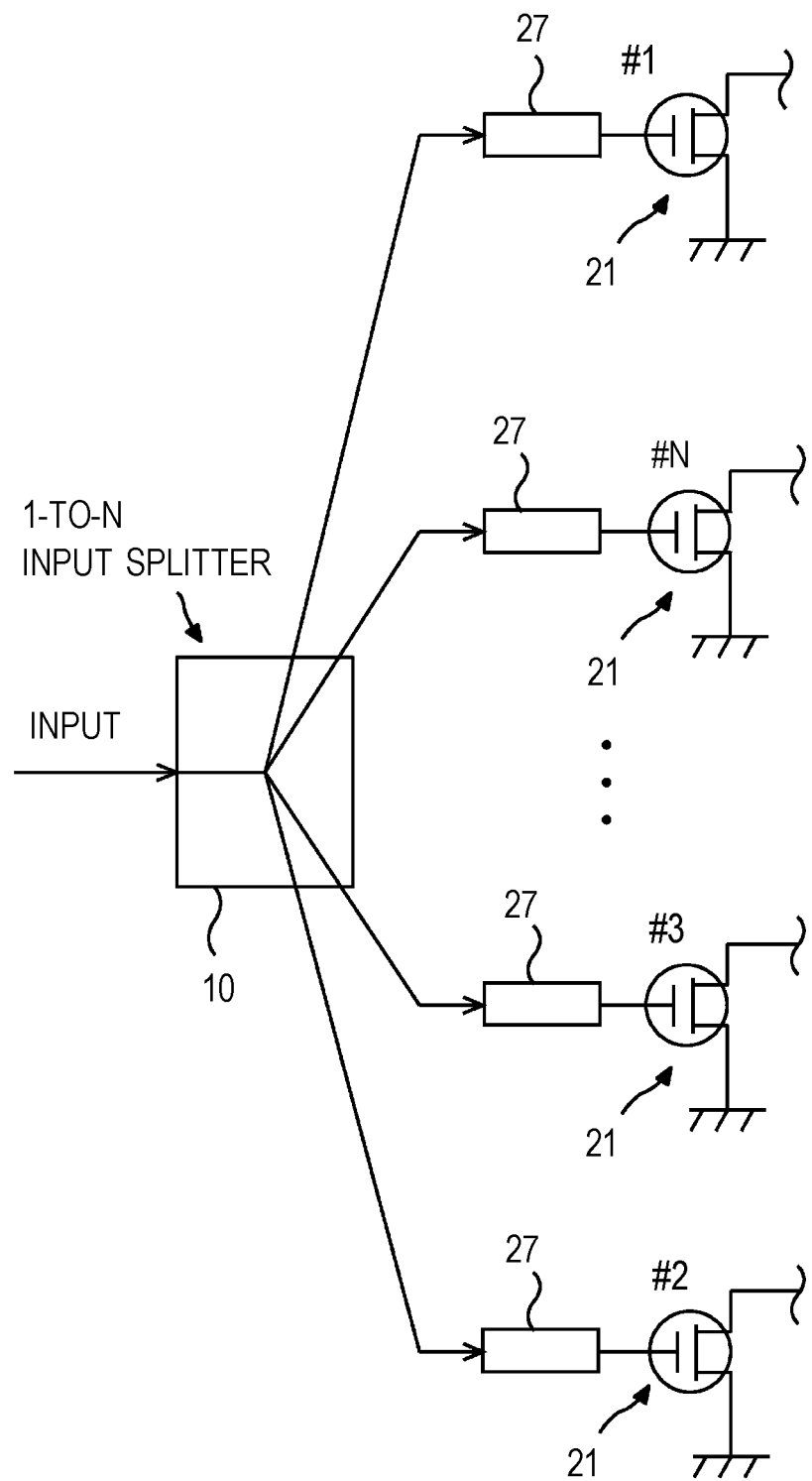
FIG. 23 is a diagram illustrating a configuration example of an input splitter included in the amplifier circuit.

FIG. 23 is a diagram illustrating a configuration example of an input splitter included in the amplifier circuit. The splitter 10 in the amplifier circuit of FIG. 23 splits the input signal to the N branches. In FIG. 23, the configuration of the circuit in the output side of the transistors 21 is not shown. The configuration of the circuit in the output side of the transistors 21 can be similar to any of the circuits illustrated in the figures. The splitter 10 can be implemented with an analog circuit or a digital circuit. If the splitter 10 is implemented with a digital circuit, the digital circuit can adjust the electrical lengths of the paths between the terminals.

Figure 24:
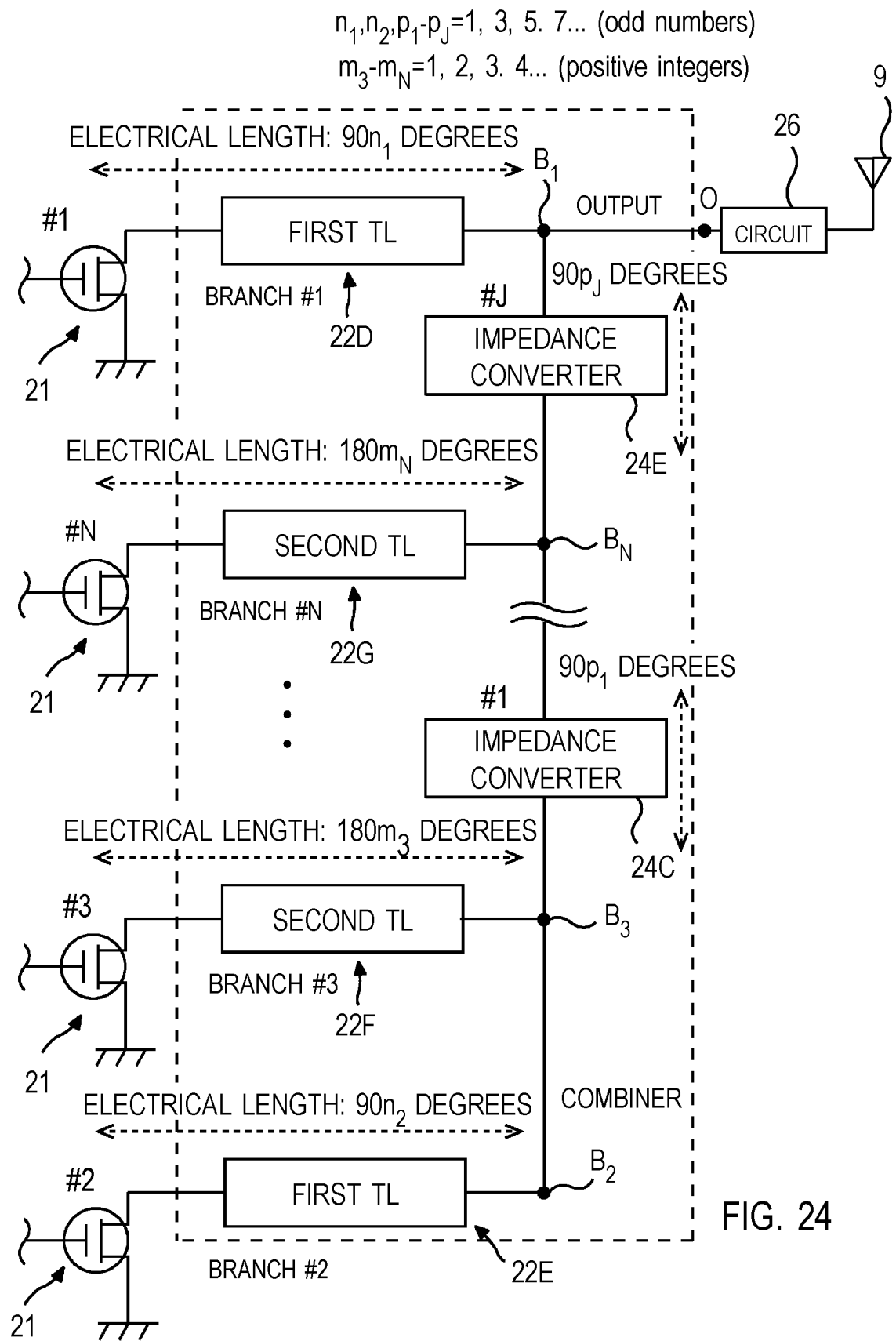
FIG. 24 is a diagram illustrating an example of an amplifier circuit implemented in a transmitting device.

FIG. 24 is a diagram illustrating an example of an amplifier circuit implemented in a transmitting device. In the amplifier circuit of FIG. 24, a circuit 26 and an antenna 9 is connected to the output side, in series. The circuit 26 can be an impedance matching circuit for matching the impedance between the amplifier circuit 8 and the antenna 9. However, the features and the configuration of the circuit 26 are not limited.

In the first embodiment, an example when the amplifier circuit amplifies the wireless signal transmitted by the transmitting device was described. However, the amplifier circuit can be implemented in any other type of device. Also, the usage of the amplifier circuit is not limited to the examples described above. In the above examples, the amplifier circuit was used to amplify carrier frequency signals. However, the frequency range of the amplified signals are not limited.

Figure 25:
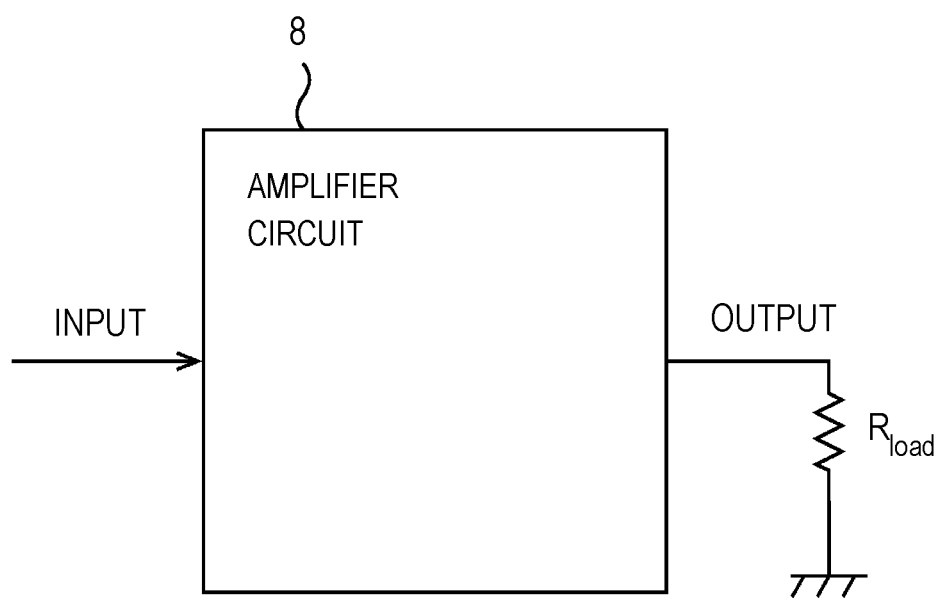
FIG. 25 is a diagram illustrating a first example of a load connected to the output side of the amplifier circuit.

FIG. 25 is a diagram illustrating a first example of a load connected to the output side of the amplifier circuit. A load $R_{load}$ is connected to the output of the amplifier circuit 8. The load $R_{load}$ can be any machine, component or device.

Figure 26:
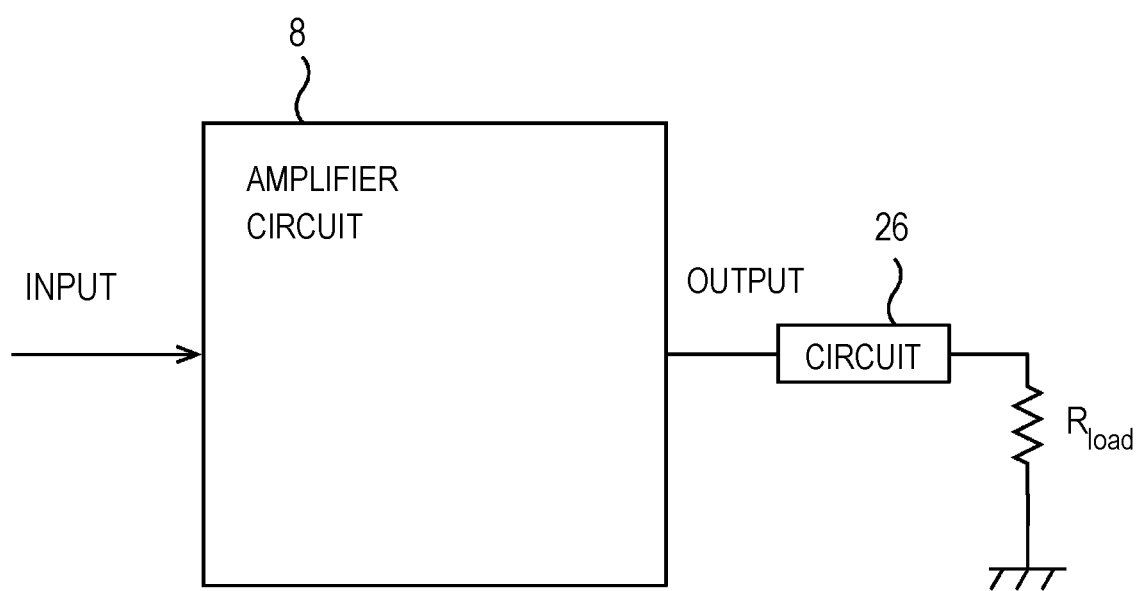
FIG. 26 is a diagram illustrating a second example of a load connected to the output side of the amplifier circuit.

FIG. 26 is a diagram illustrating a second example of a load connected to the output side of the amplifier circuit. A circuit 26 and a load $R_{load}$ is connected to the output of the amplifier circuit 8, in series. The circuit 26 can be an impedance matching circuit for matching the impedance between the amplifier circuit 8 and the load $R_{load}$. However, the configuration and features of the circuit 26 are not limited. The configuration of the amplifier circuit 8 in FIG. 25 and FIG. 26 can be similar to either of the amplifier circuits described in the above figures.

By using the amplifier circuit according to the above embodiments, efficient amplification of signals is possible for signals with large fluctuations in the signal amplitude. Also, the distortion of the output signals is reduced. Also, by using the amplifier circuit according to the above embodiments, it is possible to reduce the impact of parasitic components which exist in the circuit and harmonic components of the signal.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An amplifier circuit comprising:
N (N>=3) transistors connected in parallel;
two first branches each including the transistor and a first transmission line which is connected to an output terminal of the transistor; and
N−2 second branches each including the transistor and a second transmission line which is connected to the output terminal of the transistor, wherein
for each of the first branches, a sum between an electrical length of a parasitic component of the transistor and the electrical length of the first transmission line are approximately 90*n degrees, where n is an odd integer, and for each of the second branches, the sum between the electrical length of the parasitic component of the transistor and the electrical length of the second transmission line are multiples of approximately 180 degrees, wherein
for at least one of the two first branches or the second branches, both a resistance component and a reactance component of a load impedance of the transistor operating in an intrinsic region for harmonic components is configured to a value equal to or smaller than a second load impedance wherein, the second load impedance is the load impedance when power efficiency takes a maximum value for a fundamental frequency.

2. The amplifier circuit according to claim 1, wherein
for at least one of the two first branches, an impedance of load side including the parasitic component of the transistor and the first transmission line in harmonic frequency is smaller than a load impedance for fundamental frequency.

3. The amplifier circuit according to claim 1, wherein
for at least one of the N−2 second branches, an impedance of load side including the parasitic component of the transistor and the second transmission line in harmonic frequency is smaller than a load impedance for a fundamental frequency.

4. The amplifier circuit according to claim 1, wherein
for at least one of the two first branches or the second branches, both a resistance component and a reactance component of a load impedance of the transistor operating in an intrinsic region for harmonic components is configured to a value equal to or smaller than a first load impedance wherein, the first load impedance is the load impedance when the output power of the transistor in the intrinsic region takes a maximum value for a fundamental frequency.

5. The amplifier circuit according to claim 1, wherein
for at least one of the two first branches or the second branches, both a resistance component and a reactance component of a load impedance of the transistor in the intrinsic region for harmonics is configured to a value equal to or smaller than a value between a real part of a first load impedance and the real part of a second load impedance, the first load impedance is the load impedance when the output power of the transistor in the intrinsic region takes a maximum value for a fundamental frequency and the second load impedance is the load impedance when power efficiency takes a maximum value for the fundamental frequency.

6. The amplifier circuit according to claim 1, wherein
DC voltages applied to input terminals for each of the transistors are configured to different values, and the DC voltage applied to the input terminal of the transistor in the second branch is configured to a value lower than the DC voltage applied to the input terminal of the transistor in the first branch.

7. The amplifier circuit according to claim 6, wherein
the transistors are field-effect transistors and the input terminals are gate terminals.

8. The amplifier circuit according to claim 6, further comprising:
an impedance converter connected between output terminals of the second branches or between the output terminal of either of the first branches and the output terminal of the second branch, wherein
the electrical length of the impedance converter is approximately 90 degrees*n degrees.

9. The amplifier circuit according to claim 6, further comprising:
an impedance converter connected in series to at least either of the first transmission lines or the second transmission lines,
wherein electrical length of the impedance converter is approximately 90 degrees*n degrees.

10. The amplifier circuit according to claim 8, wherein
the impedance converter is not connected between an output side of the first branch with second lowest DC voltage applied to the input terminal for the transistor and the output side of the second branch with third lowest DC voltage applied to the input terminal for the transistor.

11. The amplifier circuit according to claim 6, wherein
at least either of the first transmission lines, the second transmission lines and impedance converters include at least either coplanar waveguides, slotline transmission lines, stripline transmission lines, micro stripline transmission lines, open stubs, transmission lines with widths changing stepwise in length direction, capacitors connected between a ground and cascaded inductors.

12. The amplifier circuit according to claim 6, further comprising:
a combiner configured to provide an output signal combining input signals from the first branches and the second branches, from an output terminal.

13. The amplifier circuit according to claim 12, wherein
the DC voltage applied to the input terminal of the transistor in the first branch without an impedance converter connected between the output terminal of the combiner and the output terminal of the first branch is smaller than the first branch with the impedance converter connected between the output terminal of the combiner and the output terminal of the first branch.

14. The amplifier circuit according to claim 12, wherein
differences of first electrical lengths, differences of second electrical lengths and differences between either of the first electrical lengths and either of the second electrical lengths are approximately 0 degrees or multiples of approximately 360 degrees, the first electrical length is the electrical length of a path between an input terminal of the first branch and the output terminal of the combiner, and the second electrical length is the electrical length of the path between the input terminal of the second branch and the output terminal of the combiner.

15. The amplifier circuit according to claim 12, wherein differences of first electrical lengths, differences of second electrical lengths and differences between either of the first electrical lengths and either of the second electrical lengths are multiples of approximately 360 degrees including 0 degrees, plus an arbitrary degrees with an absolute value which is equal to or smaller than 30 degrees, the first electrical length is the electrical length of a path between an input terminal of the first branch and the output terminal of the combiner, and the second electrical length is the electrical length of the path between the input terminal of the second branch and the output terminal of the combiner.

16. The amplifier circuit according to claim 8, wherein widths of output sides of the first transmission line, the second transmission line and the impedance converter are equal.

17. A transmitting device comprising:
the amplifier circuit according to claim 1, wherein
the amplifier circuit is configured to amplify transmitted signals.

* * * * *